(12) United States Patent
Kim et al.

(10) Patent No.: US 12,249,505 B2
(45) Date of Patent: Mar. 11, 2025

(54) SEMICONDUCTOR DEVICE INCLUDING EPITAXIAL REGION

(71) Applicant: Samsung Electronics Co., Ltd., Suwon-si (KR)

(72) Inventors: Gyeom Kim, Hwaseong-si (KR); Dongwoo Kim, Incheon (KR); Jihye Yi, Suwon-si (KR); Jinbum Kim, Seoul (KR); Sangmoon Lee, Suwon-si (KR); Seunghun Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/513,297

(22) Filed: Nov. 17, 2023

(65) Prior Publication Data
US 2024/0087884 A1 Mar. 14, 2024

Related U.S. Application Data

(63) Continuation of application No. 17/853,990, filed on Jun. 30, 2022, now Pat. No. 11,869,765, which is a
(Continued)

(30) Foreign Application Priority Data
Nov. 19, 2019 (KR) .................. 10-2019-0148399

(51) Int. Cl.
*H01L 21/02* (2006.01)
*B82Y 10/00* (2011.01)
(Continued)

(52) U.S. Cl.
CPC .. *H01L 21/02293* (2013.01); *H01L 21/28518* (2013.01); *H01L 21/76897* (2013.01);
(Continued)

(58) Field of Classification Search
CPC ......... H01L 29/41766; H01L 29/66553; H01L 29/6656; H01L 21/28518; H01L 21/76897;
(Continued)

(56) References Cited

U.S. PATENT DOCUMENTS 8,415,250 B2  4/2013  Alptekin et al.
9,012,281 B2  4/2015  Suk et al.
(Continued)

FOREIGN PATENT DOCUMENTS

CN  101335207 A  12/2008
CN  108281481 A  7/2018
(Continued)

*Primary Examiner* — Sonya McCall-Shepard
(74) *Attorney, Agent, or Firm* — Muir Patent Law, PLLC

(57) ABSTRACT

A semiconductor device is provided. The semiconductor device includes: an active region on a semiconductor substrate; a channel region on the active region; a source/drain region adjacent to the channel region on the active region; a gate structure overlapping the channel region, on the channel region; a contact structure on the source/drain region; a gate spacer between the contact structure and the gate structure; and a contact spacer surrounding a side surface of the contact structure. The source/drain region includes a first epitaxial region having a recessed surface and a second epitaxial region on the recessed surface of the first epitaxial region, and the second epitaxial region includes an extended portion, extended from a portion overlapping the contact structure in a vertical direction, in a horizontal direction and overlapping the contact spacer in the vertical direction.

19 Claims, 35 Drawing Sheets

Related U.S. Application Data continuation of application No. 17/006,799, filed on Aug. 29, 2020, now Pat. No. 11,380,541.

(51) Int. Cl.

| | |
|---|---|
| *H01L 21/28* | (2006.01) |
| *H01L 21/285* | (2006.01) |
| *H01L 21/768* | (2006.01) |
| *H01L 21/8234* | (2006.01) |
| *H01L 23/485* | (2006.01) |
| *H01L 23/532* | (2006.01) |
| *H01L 29/06* | (2006.01) |
| *H01L 29/08* | (2006.01) |
| *H01L 29/10* | (2006.01) |
| *H01L 29/161* | (2006.01) |
| *H01L 29/165* | (2006.01) |
| *H01L 29/417* | (2006.01) |
| *H01L 29/423* | (2006.01) |
| *H01L 29/66* | (2006.01) |
| *H01L 29/775* | (2006.01) |
| *H01L 29/78* | (2006.01) |
| *H01L 29/786* | (2006.01) |

(52) U.S. Cl.
CPC .......... *H01L 21/823431* (2013.01); *H01L 21/823481* (2013.01); *H01L 23/485* (2013.01); *H01L 29/0673* (2013.01); *H01L 29/0847* (2013.01); *H01L 29/165* (2013.01); *H01L 29/41766* (2013.01); *H01L 29/41791* (2013.01); *H01L 29/42392* (2013.01); *H01L 29/66439* (2013.01); *H01L 29/66553* (2013.01); *H01L 29/6656* (2013.01); *H01L 29/775* (2013.01); *H01L 29/7848* (2013.01); *H01L 29/78696* (2013.01)

(58) Field of Classification Search
CPC ............ H01L 23/485; H01L 21/28525; H01L 21/76805; H01L 21/76831; H01L 29/665; H01L 21/02293; H01L 29/7848; H01L 21/823425; H01L 29/41783; H01L 29/161; H01L 29/0684; H01L 29/41725
See application file for complete search history.

(56) References Cited

U.S. PATENT DOCUMENTS

| | | | |
|---|---|---|---|
| 9,401,417 | B2 | 7/2016 | Chen et al. |
| 10,325,911 | B2 | 6/2019 | Lu et al. |
| 10,347,662 | B2 | 7/2019 | Hu |
| 10,347,762 | B1* | 7/2019 | Liu ............... H01L 29/66545 |
| 10,461,174 | B1 | 10/2019 | Chi et al. |
| 10,510,884 | B2* | 12/2019 | Hung ............... H01L 29/6653 |
| 2014/0217519 | A1 | 8/2014 | Qin et al. |
| 2016/0284806 | A1 | 9/2016 | Park et al. |
| 2017/0373151 | A1 | 12/2017 | Sasaki et al. |
| 2018/0240875 | A1 | 8/2018 | Gluschenkov et al. |
| 2019/0097006 | A1 | 3/2019 | Li et al. |
| 2019/0115347 | A1 | 4/2019 | Gluschenkov et al. |
| 2019/0148556 | A1 | 5/2019 | Wang et al. |
| 2019/0157269 | A1 | 5/2019 | Koh et al. |
| 2020/0035549 | A1* | 1/2020 | Wu ............... H01L 21/76805 |
| 2020/0135859 | A1 | 4/2020 | Wan et al. |
| 2021/0098583 | A1* | 4/2021 | Tsai ............... H01L 29/0673 |

FOREIGN PATENT DOCUMENTS

| | | |
|---|---|---|
| CN | 108511525 A | 9/2018 |
| CN | 109560124 A | 4/2019 |
| CN | 109755218 A | 5/2019 |
| KR | 1020160114223 A | 10/2016 |
| KR | 1020180000763 A | 1/2018 |
| KR | 1020180081202 A | 7/2018 |
| KR | 1020190049166 A | 5/2019 |

* cited by examiner

SEMICONDUCTOR DEVICE INCLUDING EPITAXIAL REGION

CROSS-REFERENCE TO RELATED APPLICATION(S)

This U.S. nonprovisional application is a continuation of U.S. patent application Ser. No. 17/853,990, filed Jun. 30, 2022, which is a continuation of U.S. patent application Ser. No. 17/006,799, filed Aug. 29, 2020, now U.S. Pat. No. 11,380,541, which claims benefit of priority under 35 U.S.C. § 119 to Korean Patent Application No. 10-2019-0148399, filed Nov. 19, 2019, in the Korean Intellectual Property Office, the disclosure of all of which are incorporated herein by reference in their entireties.

BACKGROUND

1. Field

The present inventive concept relates to a semiconductor device, and particularly, to a semiconductor device including an epitaxial region and a formation method thereof.

2. Description of Related Art

As demand for high performance, high speed, and/or multi-functionalization of a semiconductor device increases, a degree of integration of such a semiconductor device is increasing. Due to the trend for higher integration of semiconductor devices, a size of a planar metal-oxide-semiconductor field-effect transistor (MOSFET) has been reduced. In order to overcome the limitations of the operating characteristics caused by the reduction in a size of the MOSFET, efforts are being made to develop a MOSFET including a channel having a three-dimensional structure.

SUMMARY

An aspect of the present inventive concept is to provide a semiconductor device capable of improving a degree of integration.

An aspect of the present inventive concept is to provide a semiconductor device having improved performance.

An aspect of the present inventive concept is to provide a method of forming a semiconductor device having improved productivity of a semiconductor device.

According to an aspect of the present inventive concept, a semiconductor device is provided. A semiconductor device includes: an isolation layer defining a first active region on a semiconductor substrate; an interlayer insulating layer on the isolation layer; a channel region on the first active region; a source/drain region adjacent to the channel region in a first horizontal direction on the first active region; a gate structure overlapping the channel region and extending lengthwise in a second horizontal direction perpendicular to the first horizontal direction, on the channel region; a contact structure on the source/drain region; a gate spacer between the contact structure and the gate structure; and a contact spacer disposed between the contact structure and the gate spacer and disposed between the contact structure and the interlayer insulating layer. A lower end of the contact spacer and a lower end of the gate spacer are disposed at different height levels, the contact structure includes a metal-semiconductor compound layer, and a contact plug on the metal-semiconductor compound layer, the source/drain region includes a first epitaxial region having a recessed surface and a second epitaxial region on the recessed surface of the first epitaxial region, an upper surface of the second epitaxial region is in contact with the metal-semiconductor compound layer, and the second epitaxial region includes an extended portion, extending lengthwise in the first horizontal direction from a portion overlapping the contact structure in a vertical direction to a portion overlapping the contact spacer in the vertical direction.

According to an aspect of the present inventive concept, a semiconductor device is provided. The semiconductor device includes: an active region on a semiconductor substrate; a channel region on the active region; a source/drain region adjacent to the channel region on the active region; a gate structure overlapping the channel region, on the channel region; a contact structure on the source/drain region; a gate spacer between the contact structure and the gate structure; and a contact spacer surrounding a side surface of the contact structure. The contact structure includes a metal-semiconductor compound layer, and a contact plug on the metal-semiconductor compound layer, the source/drain region includes a base epitaxial region, a first epitaxial region on the base epitaxial region and a second epitaxial region on the first epitaxial region, the source/drain region includes a Si element and a Ge element, a Ge element concentration in the base epitaxial region, a Ge element concentration in the first epitaxial region, and a Ge element concentration in the second epitaxial region are different from each other, an upper surface of the second epitaxial region is in contact with the metal-semiconductor compound layer, and the second epitaxial region includes an extended portion, extending in a horizontal direction from a portion overlapping the contact structure in a vertical direction to a portion overlapping the contact spacer in the vertical direction.

According to an aspect of the present inventive concept, a semiconductor device is provided. The semiconductor device includes: an active region on a semiconductor substrate; a channel region on the active region; a source/drain region adjacent to the channel region on the active region; a gate structure overlapping the channel region, on the channel region; a contact structure on the source/drain region; a gate spacer between the contact structure and the gate structure; and a contact spacer surrounding a side surface of the contact structure. A lower end of the contact spacer and a lower end of the gate spacer are disposed at different height levels, the source/drain region includes a first epitaxial region having a recessed surface and a second epitaxial region on the recessed surface of the first epitaxial region, and the second epitaxial region includes an extended portion, extending in a horizontal direction from a portion overlapping the contact structure in a vertical direction to a portion overlapping the contact spacer in the vertical direction.

BRIEF DESCRIPTION OF DRAWINGS

The above and other aspects, features and other advantages of the present disclosure will be more clearly understood from the following detailed description, taken in conjunction with the accompanying drawings, in which.

DETAILED DESCRIPTION

Figure 1:
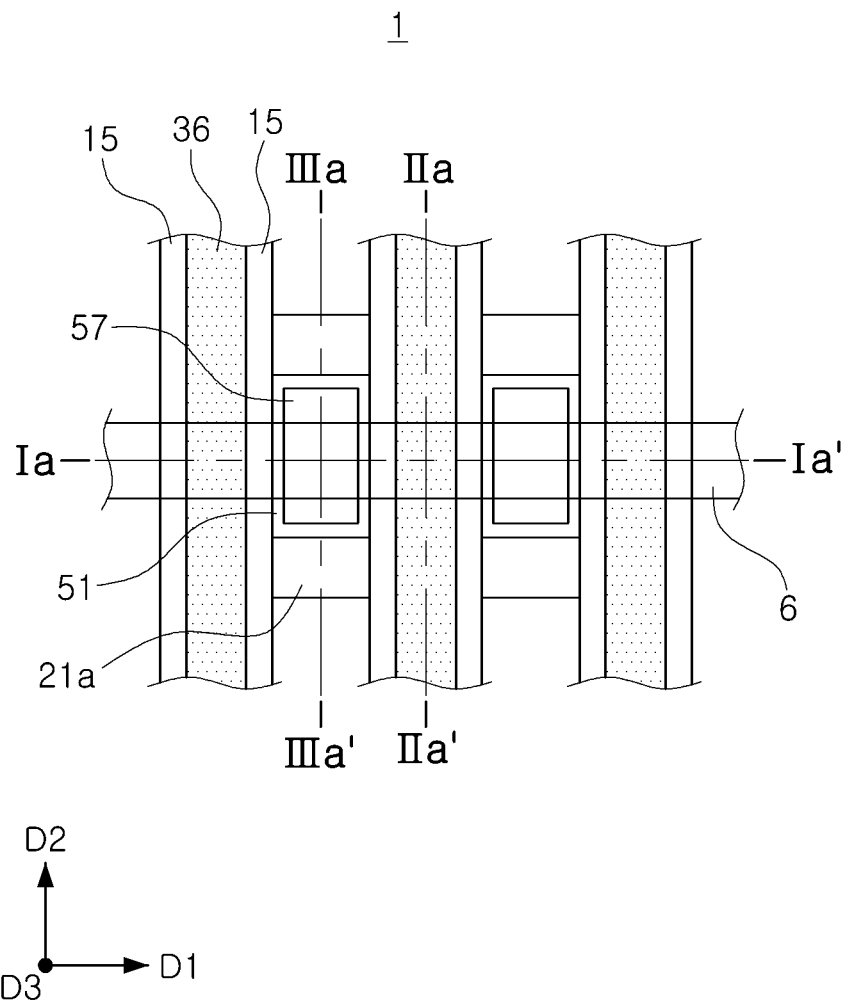
FIG. 1 is a plan view illustrating a semiconductor device, according to example embodiments.
Figure 2A:
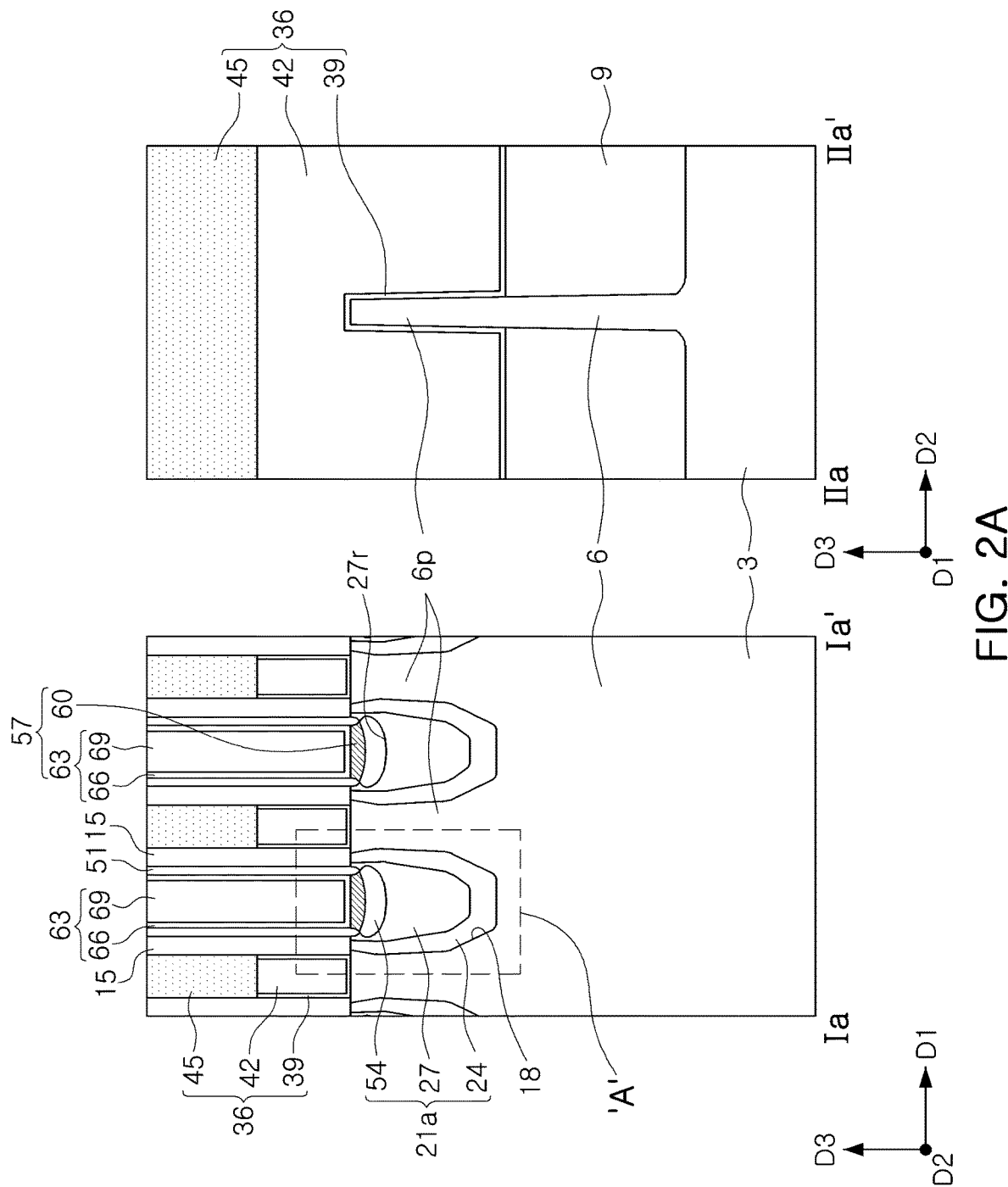
FIGS. 2A to 2C are partially enlarged cross-sectional views illustrating a semiconductor device, according to example embodiments of the present disclosure.
Figure 2B:
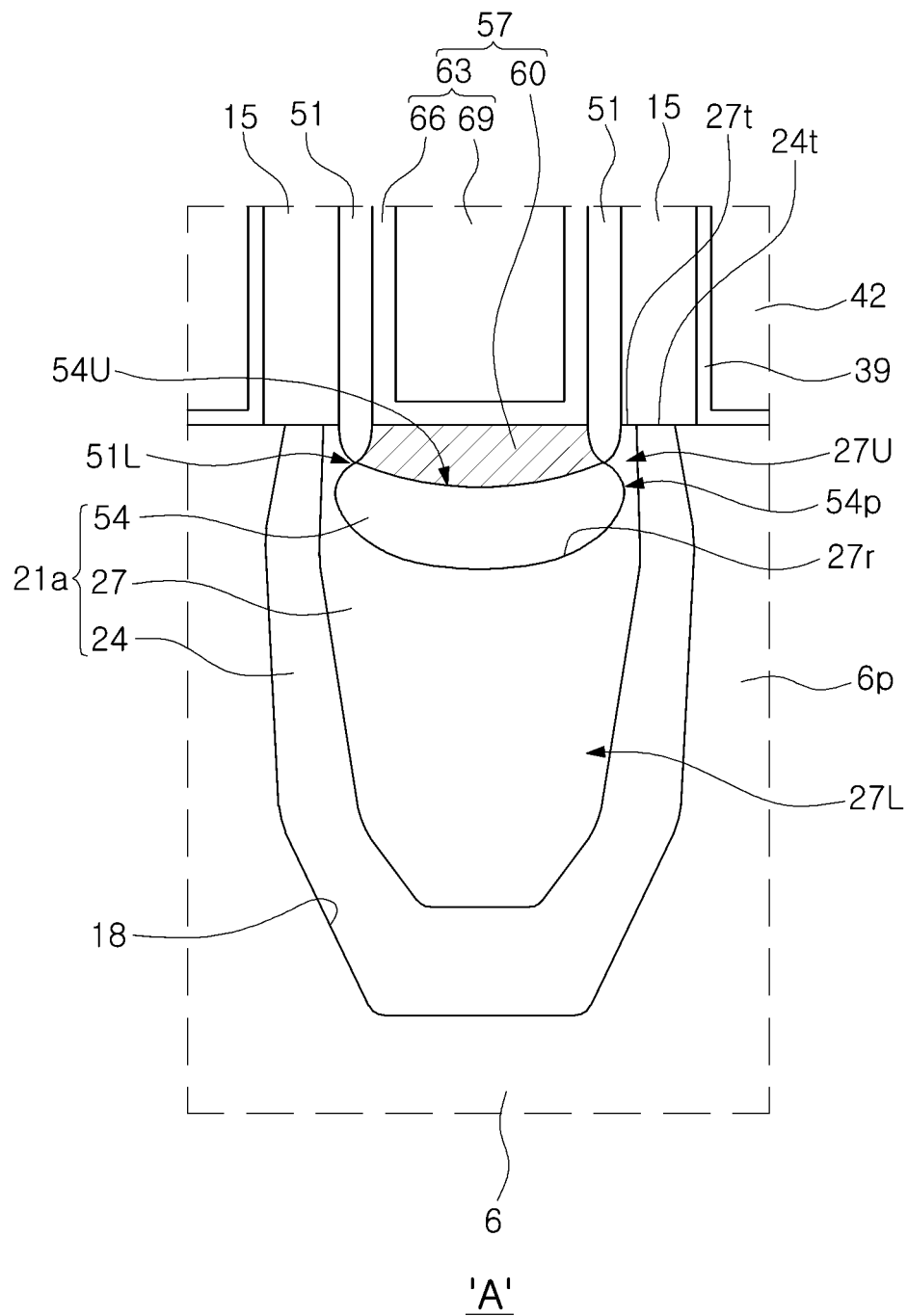
Figure 2C:
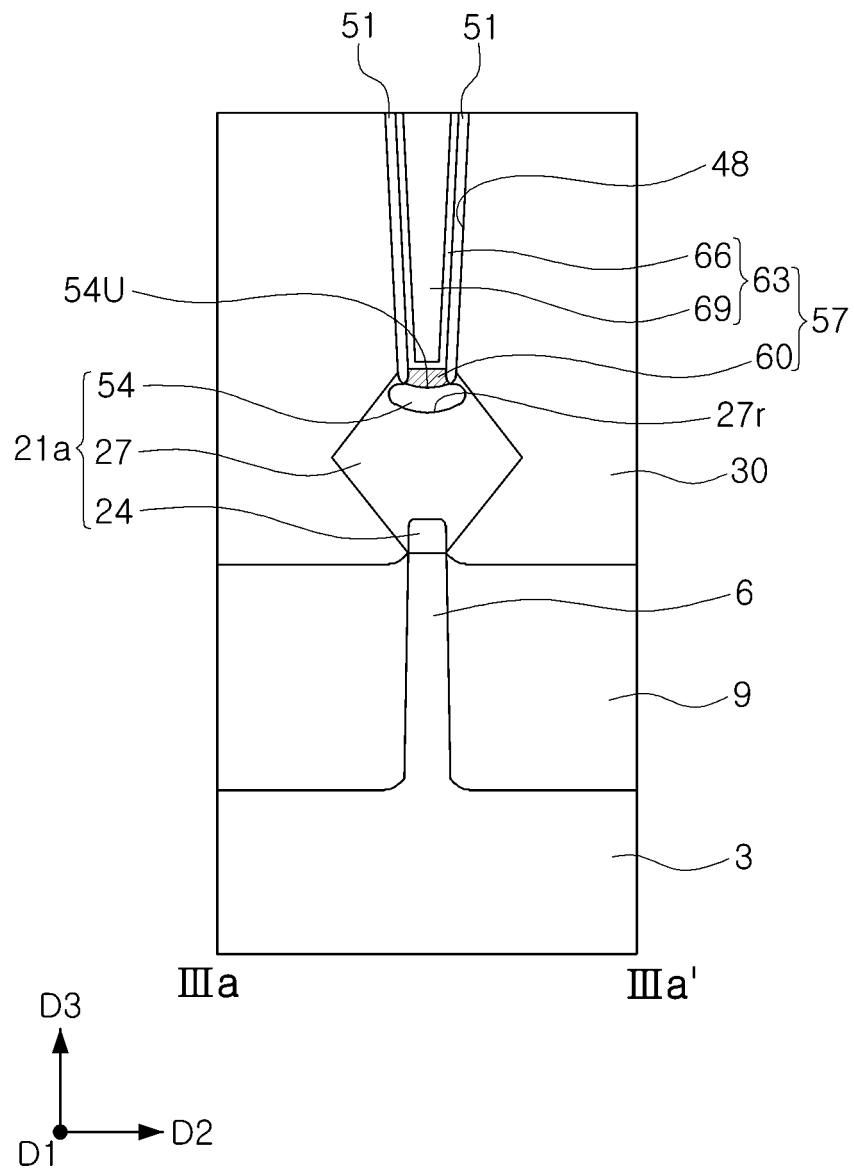

First, referring to FIGS. 1, 2A, and 3B, a semiconductor device according to an example embodiment of the present disclosure will be described. FIG. 1 is a plan view illustrating a semiconductor device according to example embodiments of the present disclosure, FIG. 2A is a cross-sectional view illustrating a region taken along line Ia-Ia' and a region taken along line IIa-IIa', of FIG. 1, to describe a semiconductor device according to example embodiments of the present disclosure, FIG. 2B is a partially enlarged view enlarging a portion indicated by 'A' of FIG. 2A, and FIG. 2C is a cross-sectional view illustrating a region taken along line IIIa-IIIa' of FIG. 1 to describe a semiconductor device according to example embodiments of the present disclosure.

Referring to FIGS. 1, and 2A to 2C, a semiconductor device 1 according to example embodiments includes a semiconductor substrate 3, an active region 6 and an isolation layer 9 on the semiconductor substrate 3, and a channel region 6p and a source/drain region 21a on the active region 6. The semiconductor substrate 3 may be formed of a semiconductor material such as silicon.

In an example, the active region 6 may have a linear shape or a bar shape extending lengthwise in a first horizontal direction D1. The first horizontal direction D1 may be parallel to an upper surface of the semiconductor substrate 3.

In an example, the isolation layer 9 may be a trench isolation layer (e.g., a shallow trench isolation layer). The isolation layer 9 may be formed of an insulating material such as silicon oxide, or the like.

In an example, the channel region 6p may be extended from the active region 6 in a vertical direction D3. For example, the channel region 6p may be formed at a vertical level higher than an upper surface of the isolation layer 9. The channel region 6p may be referred to as an active fin.

In an example, when the channel region 6p is a channel region of a PMOS transistor, the channel region 6p may have an N-type conductivity, and the source/drain region 21a may have a P-type conductivity. As another example, when the channel region 6p is a channel region of an NMOS transistor, the channel region 6p may have a P-type conductivity, and the source/drain region 21a may have an N-type conductivity.

The semiconductor device 1 may further include a gate structure 36 overlapping the channel region 6p on the active region 6, extending lengthwise in a second horizontal direction D2 perpendicular to the first horizontal direction D1, and overlapping the isolation layer 9 in the vertical direction D3, and a gate spacer 15 on a side surface of the gate structure 36. The gate structure 36 may extend lengthwise in the second horizontal direction D2 while covering an upper surface and a side surface of the channel region 6p.

The gate structure 36 may include a gate electrode 42, a gate dielectric layer 39 covering a lower surface and a side surface of the gate electrode 42, and a gate capping layer 45 on the gate electrode 42. The gate capping layer 45 may cover an upper end of the gate dielectric layer 39. In some embodiments, the gate dielectric layer 39 may contact the lower and side surfaces of the gate electrode 42. An upper surface of the gate dielectric layer 39 may be coplanar with an upper surface of the gate electrode 42. The gate capping layer 45 may contact the upper surfaces of the gate dielectric layer 39 and the gate electrode 42. Side surfaces of the gate dielectric layer 39 and the gate capping layer 45 may be aligned with one another in the vertical direction, and the gate spacer 15 may contact the side surfaces of the gate dielectric layer 39 and the gate capping layer 45. As used herein, the term "contact" refers to a direct connection (i.e., touching) unless the context indicates otherwise.

The gate dielectric layer 39 may include silicon oxide and/or a high-k dielectric. The gate electrode 42 may be formed of a conductive material such as doped silicon, metal nitride (e.g., TiN, TaN, WN, or the like), a metal (e.g., W, or the like), or the like. The gate capping layer 45 may be formed of an insulating material such as SiN, SiON, or the like. The gate spacer 15 may be formed of an insulating material such as SiO, SiN, SiON, SiOC, or the like.

The source/drain region 21a may be adjacent to the channel region 6p in the first horizontal direction D1 on the active region 6. For example, each channel region 6p may be provided between adjacent pairs of the source/drain regions 21a.

On the source/drain region 21a, a contact hole 48 may be disposed. The contact hole 48 may be defined by the interlayer insulating layer 30 in the second horizontal direction D2 and defined by the gate spacer 15 in the first horizontal direction D1.

The semiconductor device 1 may further include a contact structure 57 on the source/drain region 21a. The contact structure 57 may include a metal-semiconductor compound layer 60 and a contact plug 63 on the metal-semiconductor compound layer 60. The contact structure 57 may be disposed in the contact hole 48. The metal-semiconductor compound layer 60 may be a metal-silicon alloy layer, a metal-germanium alloy layer, or a metal-silicon-germanium alloy layer. Here, a metal in the metal-semiconductor compound layer 60 may be titanium (Ti), tantalum (Ta), nickel (Ni), or cobalt (Co).

In an example, the metal-semiconductor compound layer 60 may have a thickness in the vertical direction D3 of about 1 nm to about 10 nm.

In an example, the contact plug 63 may include a first conductive layer 66 and a second conductive layer 69. The first conductive layer 66 may cover a lower surface and a side surface of the second conductive layer 69. The first conductive layer 66 may contact the lower and side surfaces of the second conductive layer 69, and a lower surface of the first conductive layer 66 may contact an upper surface of the metal-semiconductor compound layer 60. The first conductive layer 66 may include metal nitride such as TiN, TaN, WN, or the like, while the second conductive layer 69 may include a metal such as tungsten (W), or the like.

The semiconductor device 1 may further include a contact spacer 51 in the contact hole 48 and surrounding a side surface of the contact structure 57. The contact spacer 51 may be interposed between the contact structure 57 and the interlayer insulating layer 30 in the second horizontal direction D2 while being interposed between the contact structure 57 and the gate spacer 15 in the first horizontal direction D1. The contact spacer 51 may be formed of an insulating material such as silicon oxide. An outside surface of the contact spacer 51 may contact the interlayer insulating layer 30 and the gate spacer 15, and an inside surface of the contact spacer 51 may contact the contact structure 57.

In an example, a lower end of the contact spacer 51 may be disposed at a height (vertical) level lower than a lower end of the gate spacer 15. For example, the lower end of the contact spacer 51 may be disposed at a vertical level lower than an upper surface of the channel region 6p.

In an example, a maximum thickness of the gate spacer 15 in the first horizontal direction D1 may be greater than a maximum thickness of the contact spacer 51 in the first horizontal direction D1.

The source/drain region 21a may include a first epitaxial region 27 having a recessed surface 27r and a second epitaxial region 54 on the recessed surface 27r of the first epitaxial region 27. The first epitaxial region 27 may further include an upper end 27t in contact with a lower surface of the gate spacer 15.

When a lower surface of the gate spacer 15 or an upper surface of the channel region 6p is considered as a reference plane, a maximum depth of the recessed surface 27r of the first epitaxial region 27 may be about 5 nm to about 50 nm. For example, the maximum depth of the recessed surface 27r may be about 5 nm to about 50 nm below the reference plane defined by the lower surface of the gate spacer 15 or the upper surface of the channel region 6p.

The source/drain region 21a may further include a base epitaxial region 24. The base epitaxial region 24 may be disposed between the first epitaxial region 27 and the channel region 6p and may be disposed between the first epitaxial region 27 and the active region 6. The base epitaxial region 24 may include an upper end 24t coplanar with the upper end 27t of the first epitaxial region 27.

In an example, the upper end 24t of the base epitaxial region 24 and the upper end 27t of the first epitaxial region 27 may be in contact with a lower surface of the gate spacer 15.

An upper surface 54U of the second epitaxial region 54 may be in contact with the metal-semiconductor compound layer 60 of the contact structure 57.

In an example, the upper surface 54U of the second epitaxial region 54 may have a shape bent downwards. For example, the upper surface 54U of the second epitaxial region 54 may have a convex shape.

In an example, the upper surface 54U of the second epitaxial region 54 may be disposed at a height t than a lower surface of the gate spacer 15 and a lower surface of the gate structure 36. The upper surface 54U of the second epitaxial region 54 may be disposed at a height level lower than a lower surface of the contact spacer 51.

The second epitaxial region 54 may include an extended portion 54p extended from a portion overlapping the contact structure 57 in the vertical direction D3, in the first horizontal direction D1 and overlapping the contact spacer 51 in the vertical direction D3. For example, a width in the first horizontal direction D1 of the second epitaxial region 54 including the extended portion 54p may be greater than a width in the first horizontal direction D1 of the contact structure 57.

The extended portion 54p of the second epitaxial region 54 may overlap the gate spacer 15 in the vertical direction D3. The extended portion 54p of the second epitaxial region 54 may be spaced apart from the gate spacer 15. The second epitaxial region 54 may be in contact with a lower end 51L of the contact spacer 51.

The first epitaxial region 27 may include a first lower epitaxial region 27L positioned below the extended portion 54p of the second epitaxial region 54 and a first upper epitaxial region 27U positioned above the extended portion 54p of the second epitaxial region 54. For example, the first lower epitaxial region 27L may be the portion of the first epitaxial region 27 that is formed at a vertical level lower than the extended portion 54p, and the first upper epitaxial region 27U may be the portion of the first epitaxial region 27 that is formed at a vertical level the same as or higher than the extended portion 54p. The first lower epitaxial region 27L and the first upper epitaxial region 27U may be connected to each other. For example, the first lower epitaxial region 27L and the first upper epitaxial region 27U may be in material continuity with one another. As used herein, the term "material continuity" may refer to structures, patterns, and/or layers that are formed at the same time and of the same material, without a break in the continuity of the material of which they are formed.

A maximum width of the second epitaxial region 54 in the first horizontal direction D1 may be greater than a maximum width of the metal-semiconductor compound layer 60 in the first horizontal direction D1. A maximum width of the second epitaxial region 54 in the second horizontal direction D2 may be greater than a maximum width of the metal-semiconductor compound layer 60 in the second horizontal direction D2.

A transistor including the channel region 6p, the source/drain region 21a, and the gate structure 36 may be a PMOS transistor. The source/drain region 21a may include a Si element and a Ge element. A Ge element concentration in the first epitaxial region 27 may be higher than a Ge element concentration in the base epitaxial region 24. A Ge element concentration in the second epitaxial region 54 may be higher than a Ge element concentration in the first epitaxial region 27.

In an example, the Ge element concentration in the base epitaxial region 24 may be about 1% to about 40%.

In an example, the Ge element concentration in the first epitaxial region 27 may be about 30% to about 90%.

The Ge element concentration in the second epitaxial region 54 may be about 50% to about 100%. The second epitaxial region 54 having a higher concentration of a Ge element, as compared with the base epitaxial region 24 and the first epitaxial region 27, may be a stressor applying compressive stress to the channel region 6p. Thus, since charge mobility in the channel region 6p could be increased, performance of a PMOS transistor including the channel region 6p, the source/drain region 21a, and the gate structure 36 may be improved.

The base epitaxial region 24 may have a thickness in the vertical direction D3 of about 1 nm to about 40 nm.

The first epitaxial region 27 may have a thickness in the vertical direction D3 of about 1 nm to about 50 nm.

The second epitaxial region 54 may have a thickness in the vertical direction D3 of about 1 nm to about 50 nm.

The source/drain region 21a may include at least one among boron (B), aluminum (Al), gallium (Ga), and indium (In) as P-type impurities. A concentration of the P-type impurities of the source/drain region 21a may be about 1E17 to about 1E22 atom/cc.

A maximum concentration of the P-type impurities in the second epitaxial region 54 may be higher than a minimum concentration of the P-type impurities in the first epitaxial region 27. The maximum concentration of the P-type impurities in the first epitaxial region 27 may be higher than a minimum concentration of the P-type impurities in the base epitaxial region 24.

The second epitaxial region 54 may be spaced apart from the channel region 6p, and may be in contact with the contact structure 57. For example, the base epitaxial region 24 and the first epitaxial region 27 may be between the second epitaxial region 54 and the channel region 6p, separating the second epitaxial region 54 from the channel region 6p. An impurity concentration of the second epitaxial region 54 in the source/drain region 21a is highest among the base epitaxial region 24, the first epitaxial region 27, and the second epitaxial region 54. Thus, the channel region 6p may be prevented from being degraded by P-type impurities, and the contact resistance between the source/drain region 21a and the contact structure 57 may be significantly reduced. Therefore, performance of a transistor may be improved.

Hereinafter, various modified examples of a semiconductor device according to an example embodiment of the present disclosure will be described. Hereinafter, the same numerals may refer to the same component. Thus, in the following description of the modified examples, descriptions of components overlapping with the above-described components will be omitted, and description will be given based on components which are modified or which are to be replaced.

Next, referring to FIGS. 3A to 3D, various modified examples of a semiconductor device according to an example embodiment of the present disclosure will be described. FIGS. 3A to 3D are partially enlarged views corresponding to a region, in which a portion indicated by 'A' of FIG. 2A is enlarged, to describe various modified examples of a semiconductor device according to an example embodiment of the present disclosure.

Figure 3A:
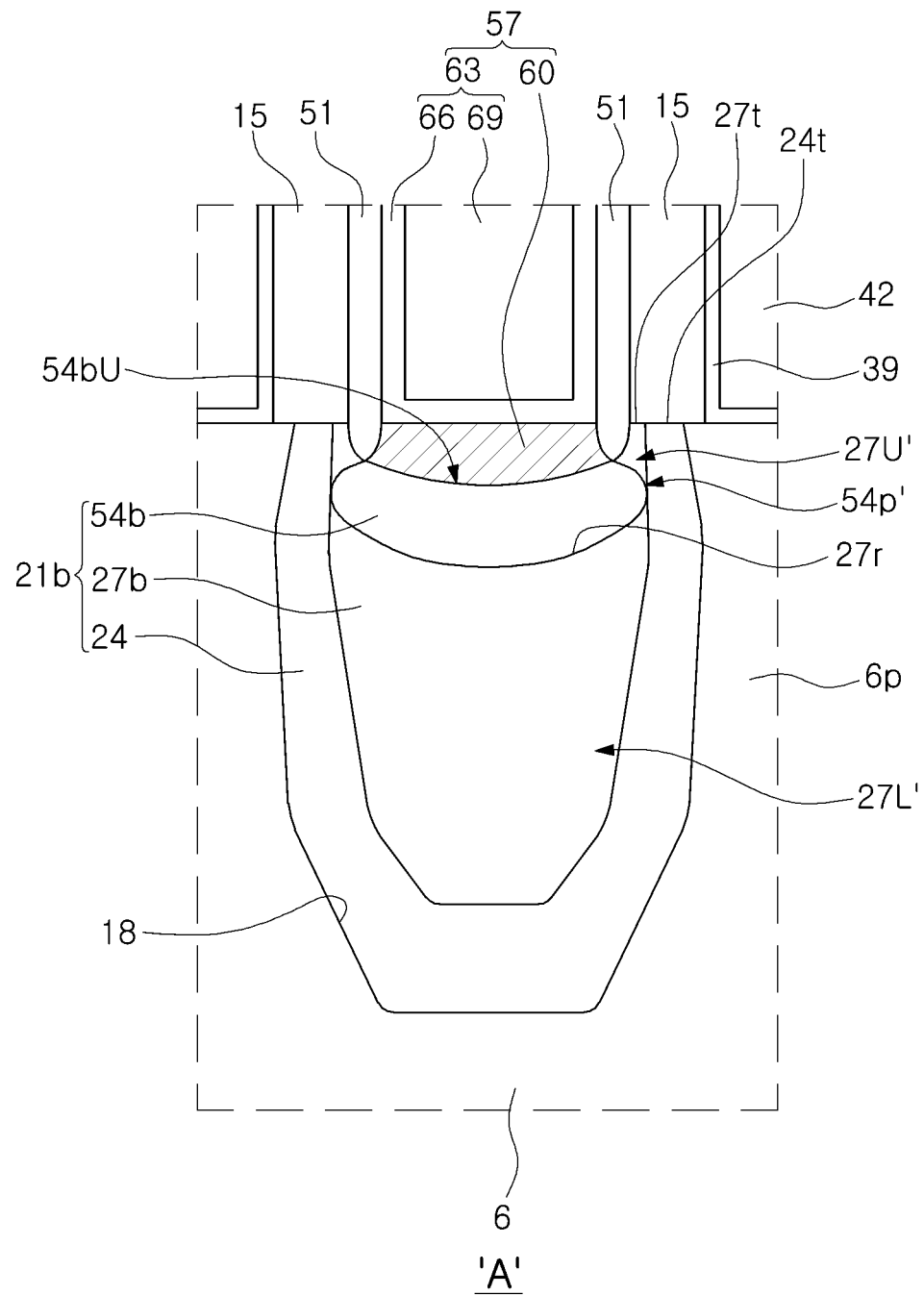
FIGS. 3A to 3D are partially enlarged cross-sectional views illustrating various modified examples of a semiconductor device, according to example embodiments of the present disclosure.

In a modified example, referring to FIG. 3A, a source/drain region 21b which may replace the source/drain region 21a of FIG. 2B may be provided.

The source/drain region 21b may include a base epitaxial region 24, a first epitaxial region 27b on the base epitaxial region 24, and a second epitaxial region 54b on the first epitaxial region 27b.

The second epitaxial region 54b may include an extended portion 54p' extended from a portion overlapping the contact structure 57 and the contact spacer 51 in a direction toward the channel region 6p and overlapping the gate spacer 15 in the vertical direction D3. The second epitaxial region 54b may contact the base epitaxial region 24. For example, the extended portion 54p' of the second epitaxial region 54b may contact the base epitaxial region 24.

The first epitaxial region 27b may include a second lower epitaxial region 27L' and a second upper epitaxial region 27U', divided in the vertical direction D3 by the extended portion 54p' of the second epitaxial region 54b. The second upper epitaxial region 27U' may be disposed on the second lower epitaxial region 27L'. An upper end 27t of the second upper epitaxial region 27U' may be in contact with a lower surface of the gate spacer 15.

Figure 3B:
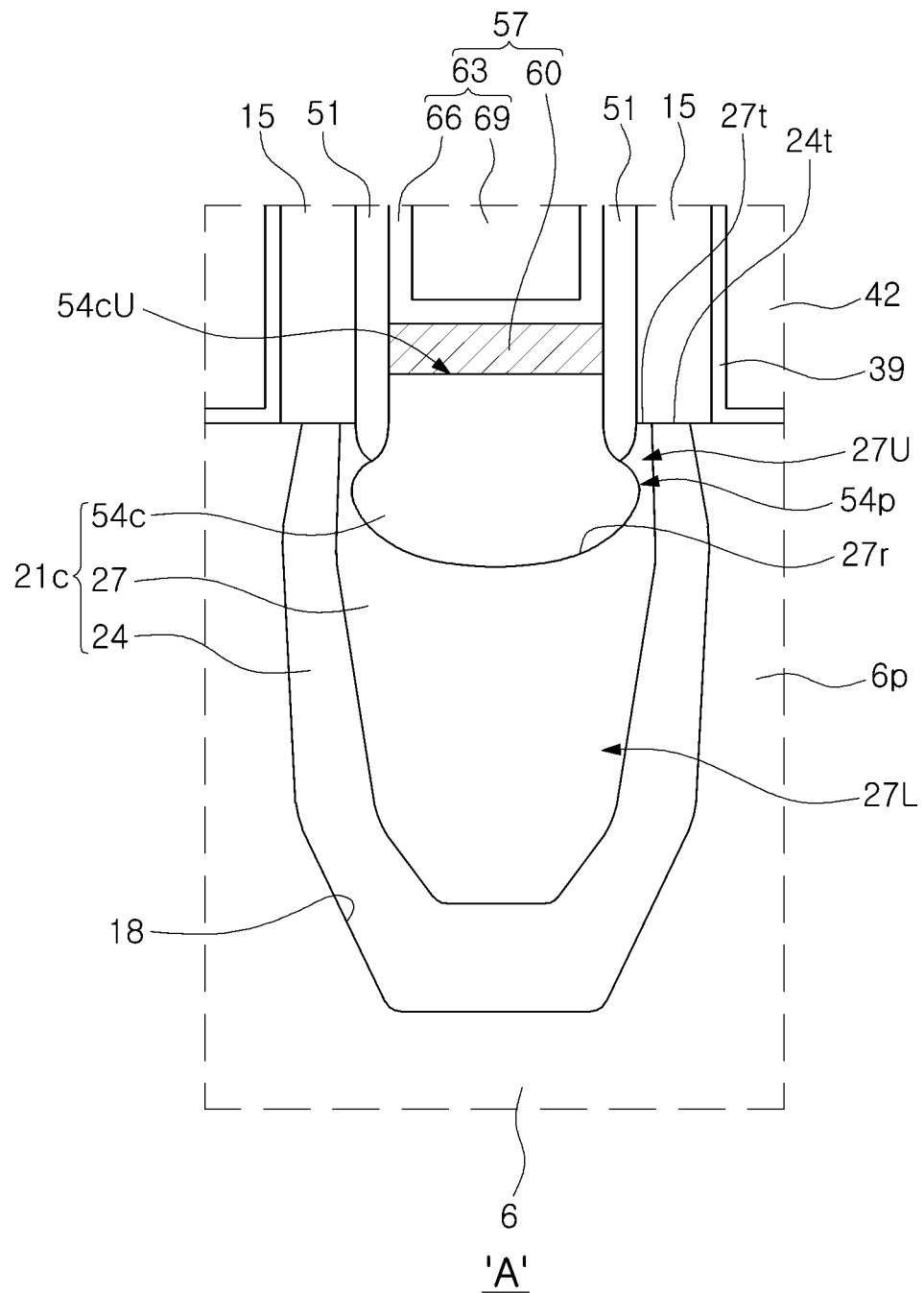

In a modified example, referring to FIG. 3B, a source/drain region 21c which may replace the source/drain region 21a of FIG. 2B may be provided.

The source/drain region 21c may include the base epitaxial region 24, a first epitaxial region 27 on the base epitaxial region 24, and a second epitaxial region 54c on the first epitaxial region 27.

In another example, in the embodiment of FIG. 3B, the first epitaxial region 27 may be replaced with the first epitaxial region 27b described with reference to FIG. 3A.

An upper surface 54cU of the second epitaxial region 54c may be disposed at a level higher than a lower surface of the gate spacer 15 and an upper surface of the channel region 6p.

The second epitaxial region 54c may include the extended portion 54p of the second epitaxial region 54 of FIG. 2B.

In another example, in the embodiment of FIG. 3B, the extended portion 54p of the second epitaxial region 54c may be replaced with the extended portion 54p' of the second epitaxial region 54b described with reference to FIG. 3A.

Figure 3C:
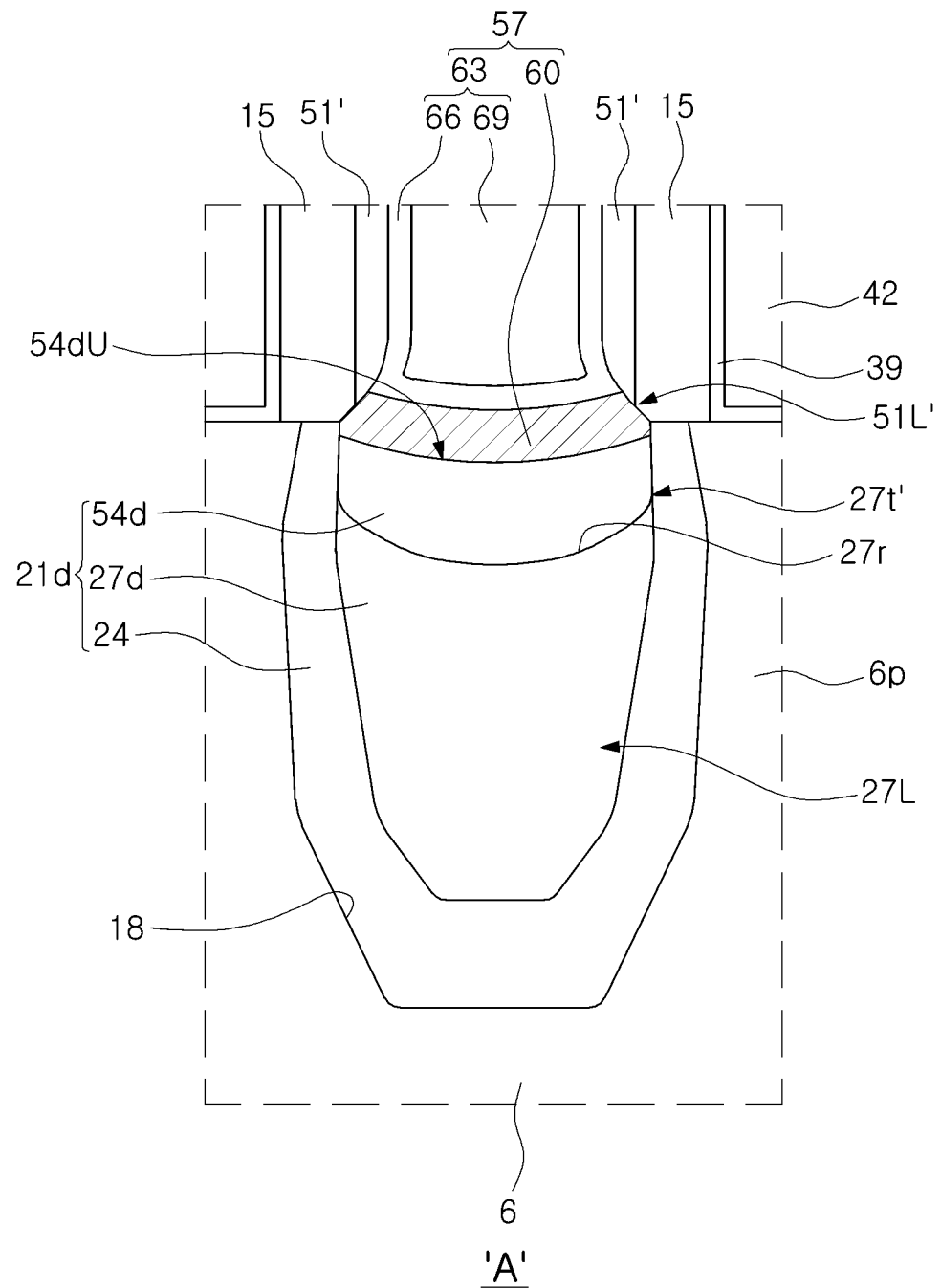

In a modified example, referring to FIG. 3C, a contact spacer 51', which may replace the contact spacer 51 of FIG. 2B, and a source/drain region 21d, which may replace the source/drain region 21a of FIG. 2B, may be provided.

A lower end 51L' of the contact spacer 51' may be disposed at a height level higher than a lower surface of the gate spacer 15. The metal-semiconductor compound layer 60 may contact the gate spacer 15.

The source/drain region 21d may include a base epitaxial region 24, a first epitaxial region 27d on the base epitaxial region 24, and a second epitaxial region 54d on the first epitaxial region 27d. The metal-semiconductor compound layer 60 may contact the base epitaxial region 24.

The first epitaxial region 27d may have a recessed surface 27r.

The first epitaxial region 27d may have a pointed upper end 27t', while the recessed surface 27r may be recessed from the upper end 27*t*'. The first epitaxial region 27*d* may be spaced apart from the contact spacer 51' and the gate spacer 15.

The second epitaxial region 54*d* may be extended from a portion overlapping the contact structure 57 in a direction toward the channel region 6*p* (for example, the D1 direction of FIG. 1) and may overlap the contact spacer 51' and the gate spacer 15 in a vertical direction D3. The second epitaxial region 54*d* may be in contact with the base epitaxial region 24.

The second epitaxial region 54*d* may be spaced apart from the contact spacer 51' and the gate spacer 15. The upper surface 54*d*U of the second epitaxial region 54*d* may be disposed at a height level lower than an upper surface of the channel region 6*p* and a lower surface of the gate spacer 15.

Figure 3D:
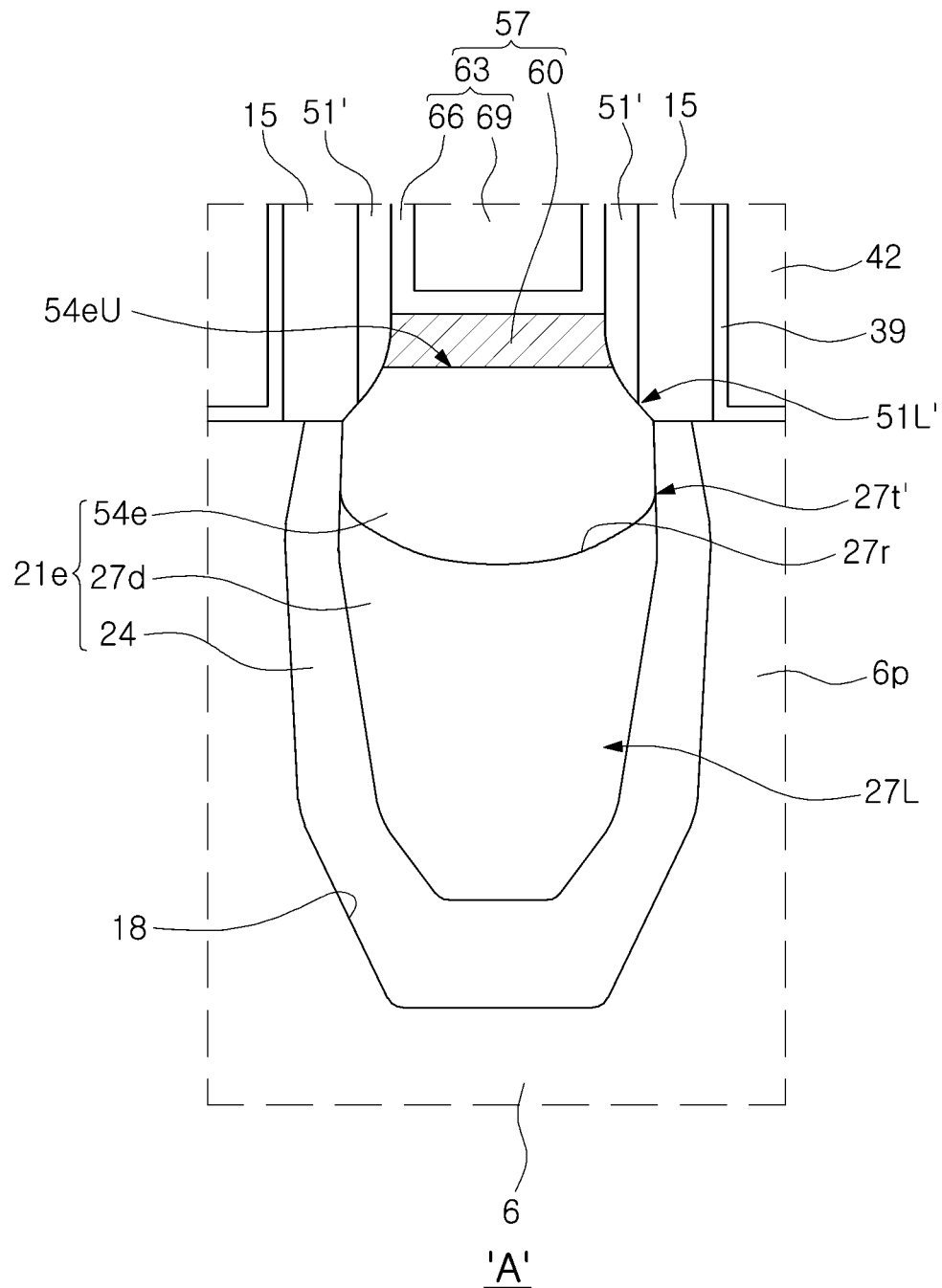

In a modified example, referring to FIG. 3D, together with the contact spacer 51' of FIG. 3C, a source/drain region 21*e*, which may replace the source/drain region 21*d* of FIG. 3C, may be provided.

The source/drain region 21*e* may include the base epitaxial region 24, the first epitaxial region 27*d* of FIG. 3C on the base epitaxial region 24, and a second epitaxial region 54*e* on the first epitaxial region 27*d*.

The upper surface 54*e*U of the second epitaxial region 54*e* may be disposed at a height level higher than an upper surface of the channel region 6*p* and a lower surface of the gate spacer 15. The upper surface 54*e*U of the second epitaxial region 54*e* may be planar and parallel to the upper surface of the semiconductor substrate 3. The second epitaxial region 54*e* may be in contact with the contact spacer 51' and the gate spacer 15.

Figure 4A:
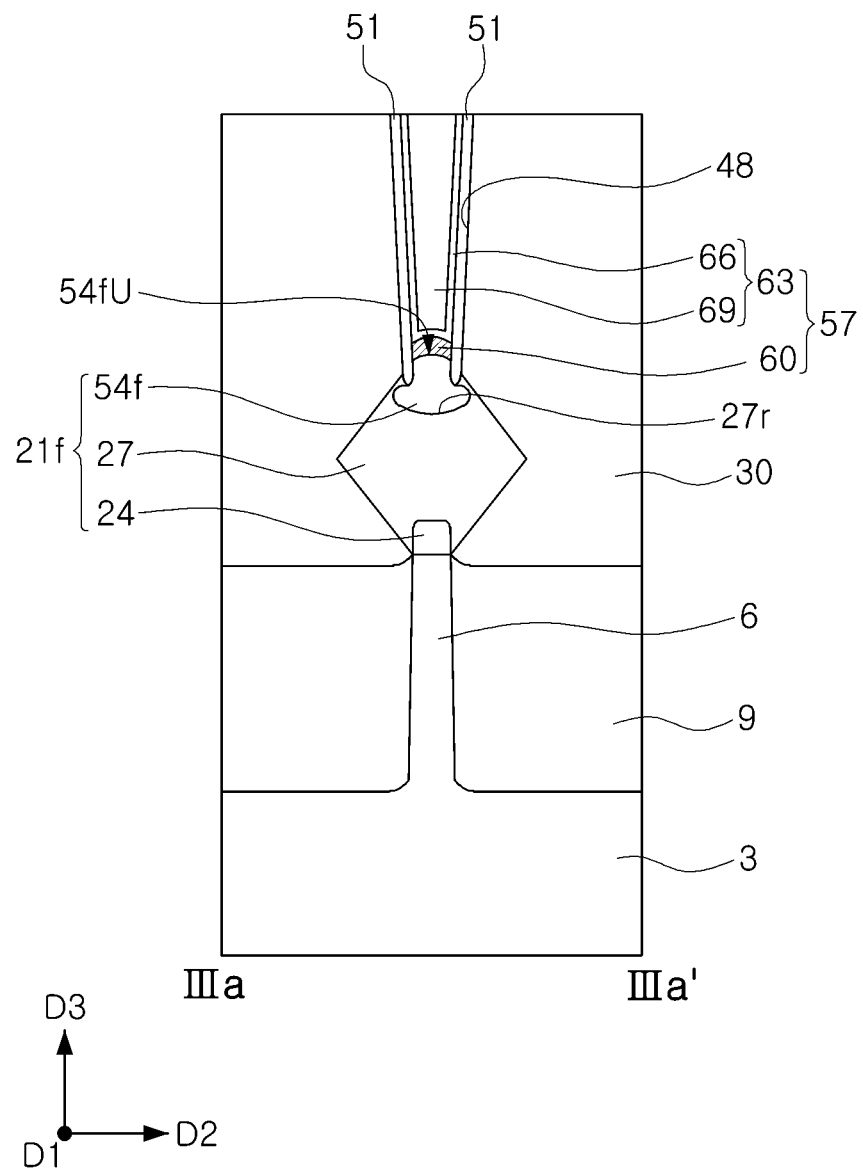
FIGS. 4A to 4C are partially enlarged cross-sectional views illustrating various modified examples of a semiconductor device, according to example embodiments of the present disclosure.
Figure 4B:
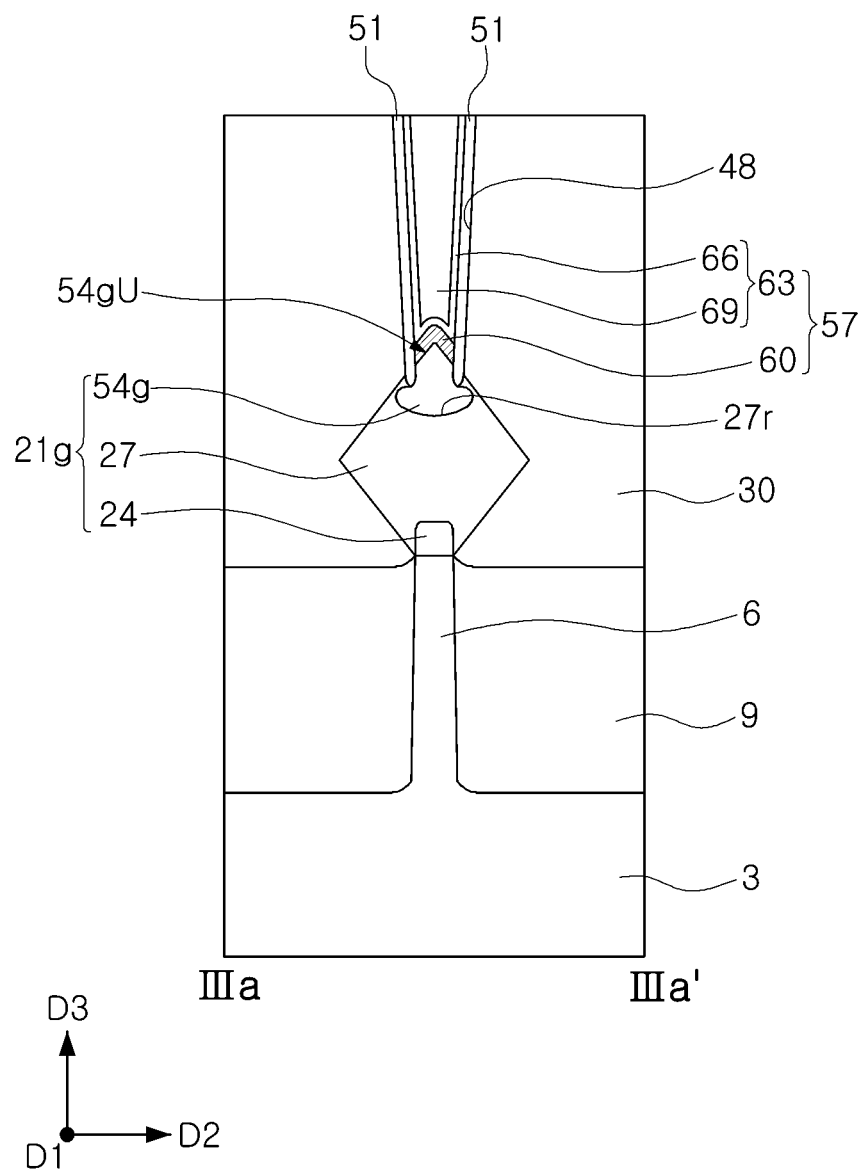
Figure 4C:
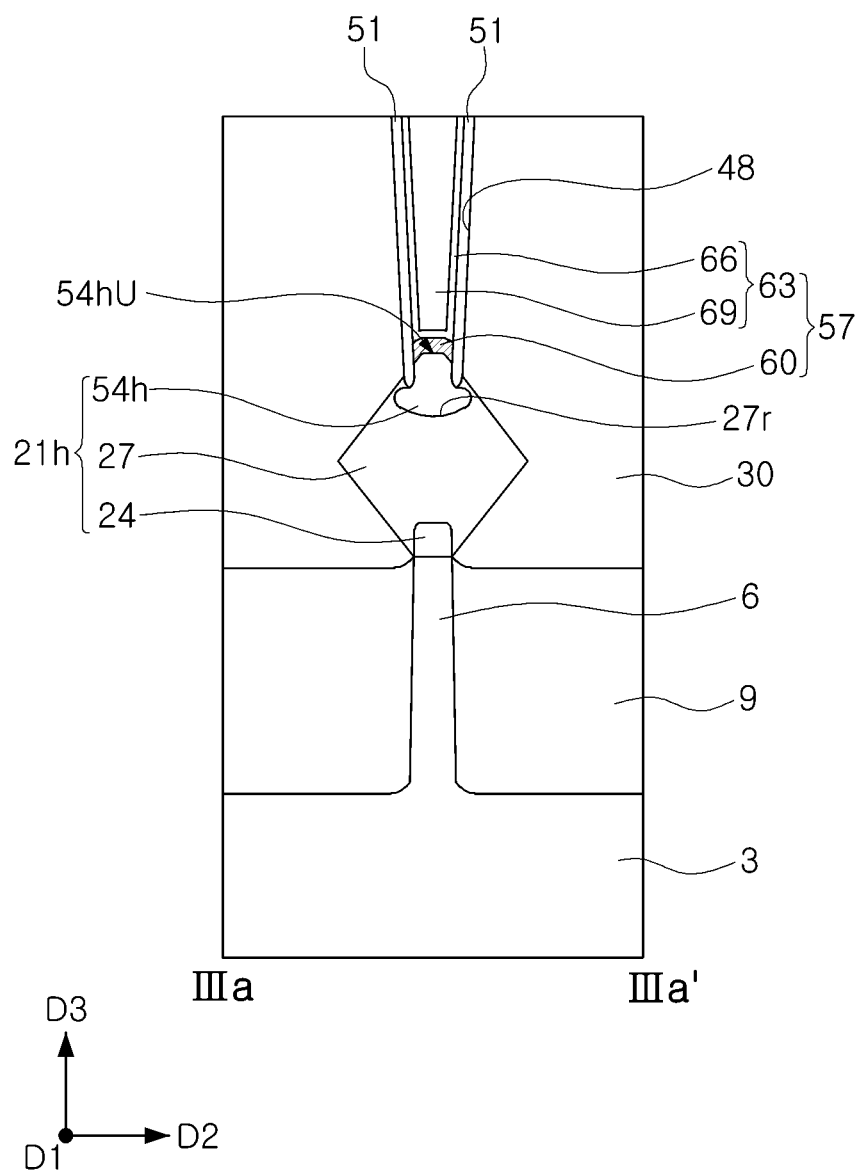

Next, referring to FIGS. 4A to 4C, various modified examples of a semiconductor device according to an example embodiment of the present disclosure will be described. FIGS. 4A to 4C are cross-sectional views illustrating various modified examples of a cross-sectional structure of FIG. 2C to describe various modified examples of a semiconductor device according to an example embodiment of the present disclosure.

In a modified example, referring to FIG. 4A, a source/drain region 21*f*, which may replace the source/drain region 21*a* of FIG. 2C, may be provided.

The source/drain region 21*f* may include the base epitaxial region 24, a first epitaxial region 27 on the base epitaxial region 24, and a second epitaxial region 54*f* on the first epitaxial region 27.

The upper surface 54*f*U of the second epitaxial region 54*f* may be disposed at a height level higher than a lower end of the contact spacer 51. The upper surface 54*f*U of the second epitaxial region 54*f* may have a convex shape in the form of being upwardly rounded.

In the second epitaxial region 54*f*, a maximum width of a portion located at a height level lower than a lower end of the contact spacer 51 may be greater than a maximum width of a portion located at a height level higher than a lower end of the contact spacer 51.

In a modified example, referring to FIG. 4B, a source/drain region 21*g*, which may replace the source/drain region 21*f* of FIG. 4A, may be provided.

The source/drain region 21*g* may include the base epitaxial region 24, the first epitaxial region 27 on the base epitaxial region 24, and a second epitaxial region Mg on the first epitaxial region 27.

The upper surface 54*g*U of the second epitaxial region 54*g* may be disposed at a height level higher than a lower end of the contact spacer 51. The upper surface 54*f*U of the second epitaxial region 54*g* may have a shape pointed upwards.

In a modified example, referring to FIG. 4C, a source/drain region 21*h*, which may replace the source/drain region 21*g* of FIG. 4A, may be provided.

The source/drain region 21*h* may include the base epitaxial region 24, a first epitaxial region 27 on the base epitaxial region 24, and a second epitaxial region 54*h* on the first epitaxial region 27.

The upper surface 54*h*U of the second epitaxial region 54*h* may be disposed at a height level higher than a lower end of the contact spacer 51. The upper surface 54*f*U of the second epitaxial region 54*h* may include a flat upper end and a side surface inclined in a direction from the flat upper end toward the contact spacer 51.

Figure 5:
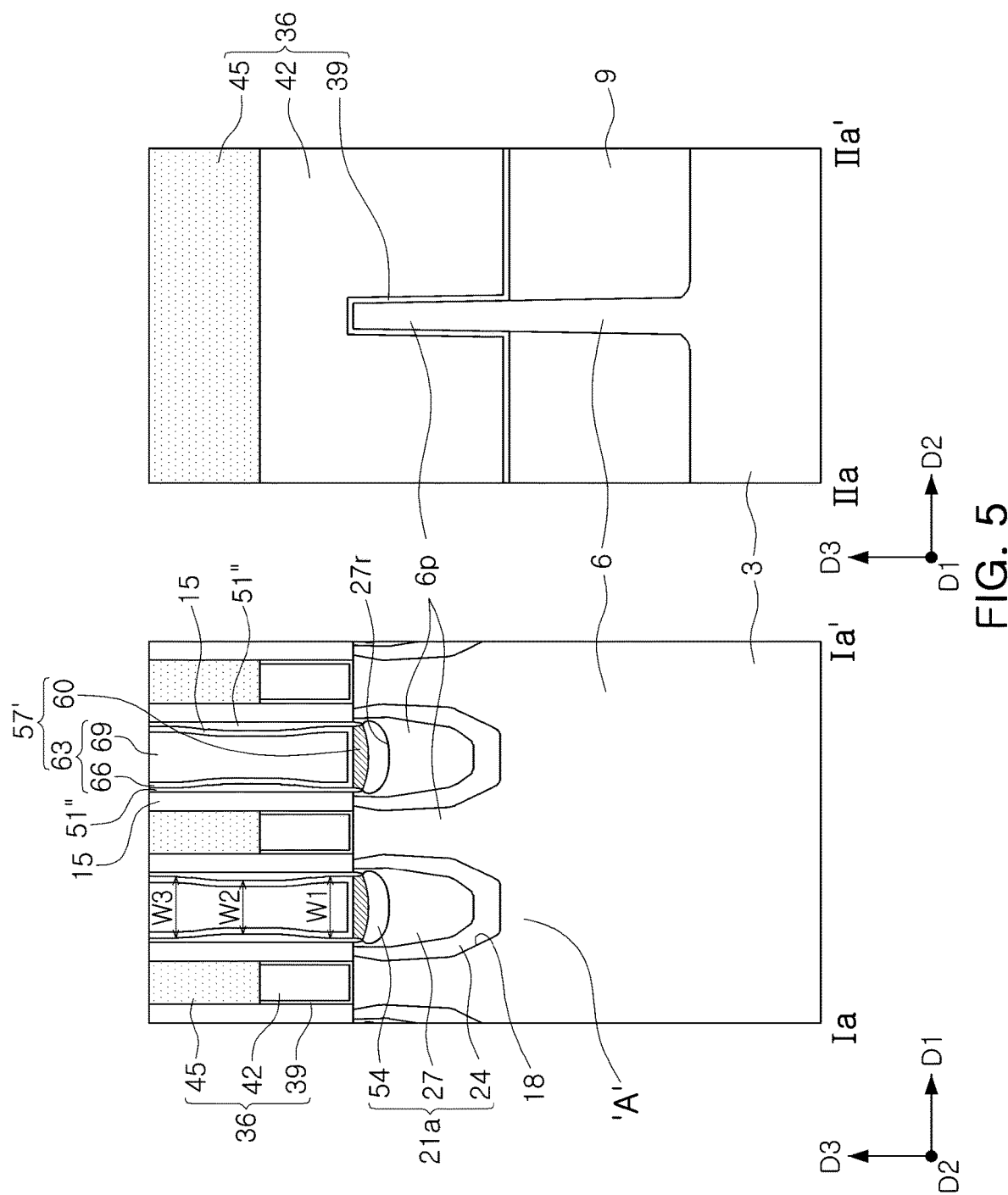
FIG. 5 is a cross-sectional view illustrating a modified example of a semiconductor device, according to example embodiments of the present disclosure.
Figure 6:
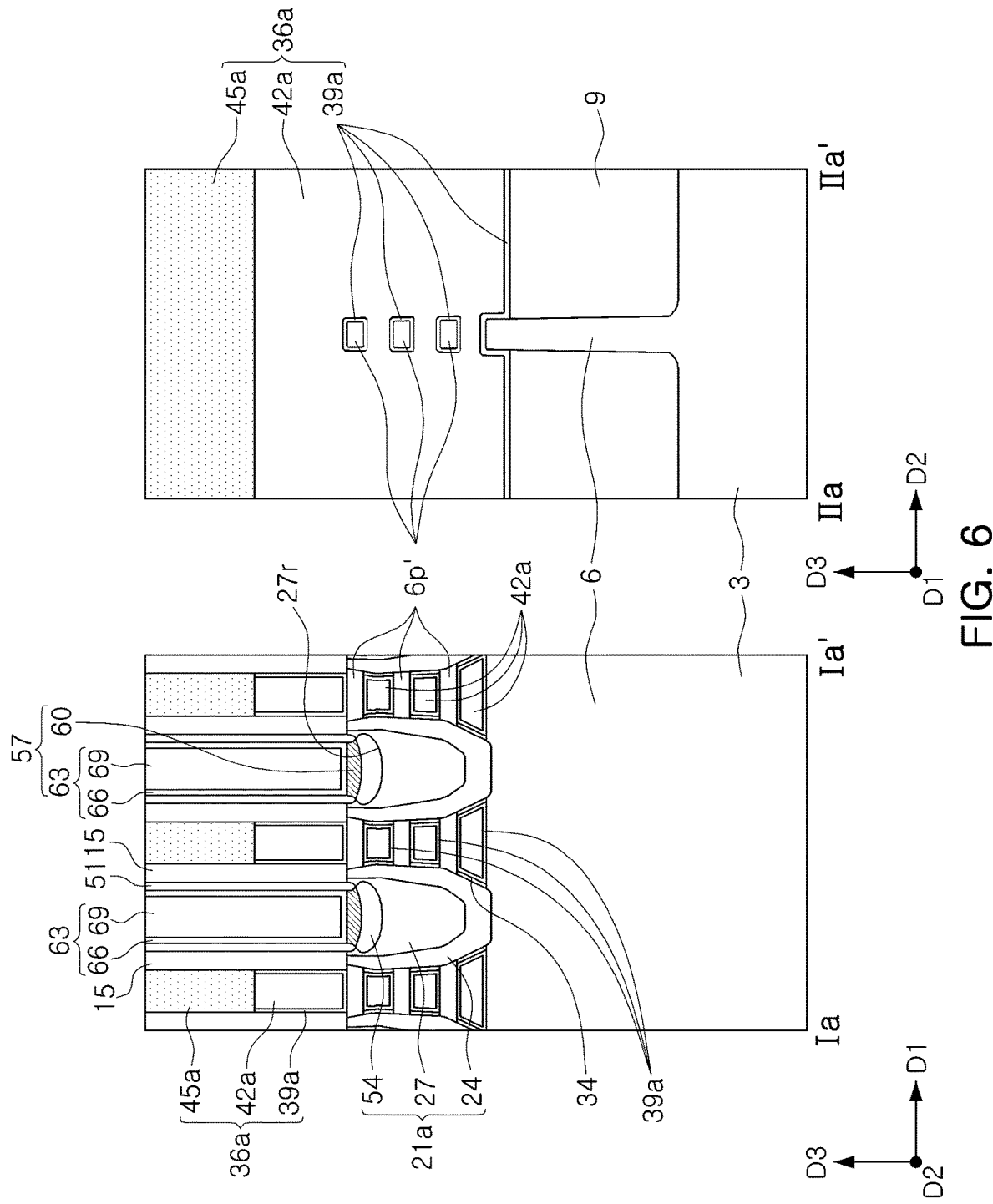
FIG. 6 is a cross-sectional view illustrating a modified example of a semiconductor device, according to example embodiments of the present disclosure.

Next, referring to FIGS. 5 and 6, various modified examples of a semiconductor device according to an example embodiment of the present disclosure will be described. FIGS. 5 and 6 are cross-sectional views illustrating various modified examples of a cross-sectional structure of FIG. 2A to describe various modified examples of a semiconductor device according to an example embodiment of the present disclosure.

In a modified example, referring to FIG. 5, the contact structure 57 of FIG. 2A may be replaced with a contact structure 57', and the contact structure 57' may include a lower region W1 having a first width, an intermediate region W2 on the lower region W1 and having a second width smaller than the first width, and an upper region W3 on the intermediate region W2 and having a third width wider than the second width. The first width of the lower region W1 may be the same width as the third width of the upper region W3.

A contact spacer 51", which may replace the contact spacer 51' of FIG. 2A, may be provided. A portion of the contact spacer 51" in contact with a portion having a minimum width of the intermediate region W2 of the contact structure 57' may have a maximum width. A portion of the contact spacer 51" in contact with the lower region W1 and a portion of the contact spacer 51" in contact with the upper region W3 may have the same width.

In a modified example, referring to FIG. 6, the channel region 6*p* of FIG. 2A may be replaced with a plurality of active layers 6*p*' stacked on the active region 6 while being spaced apart from each other in the vertical direction D3. A gate structure 36*a*, which may replace the gate structure 36 of FIG. 2A, may be provided.

The gate structure 36*a* may extend lengthwise in the second horizontal direction D2 while covering an upper surface, a side surface, and a lower surface of each of the plurality of active layers 6*p*'.

The gate structure 36*a* may include a gate dielectric layer 39*a*, a gate electrode 42*a*, and a gate capping layer 45*a*.

The gate electrode 42*a* may extend lengthwise in the second horizontal direction D2 while covering an upper surface, a side surface, and a lower surface of each of the plurality of active layers 6*p*', while the gate dielectric layer 39*a* may be interposed between the gate electrode 42*a* and the plurality of active layers 6*p*', between the gate electrode 42*a* and the active region 6, and between the gate electrode 42*a* and the isolation layer 9, while covering a side surface of the gate electrode 42*a*.

In an example, an inner insulating spacer 34, interposed between the source/drain region 21*a*, and the gate dielectric layer 39a, located below each of the plurality of active layers 6p', may be further included. The inner insulating spacer 34 may be omitted.

An upper surface of the channel region 6p described with reference to FIGS. 2A to 2C may be considered as an upper surface of an uppermost active layer of the plurality of active layers 6p'. Thus, as described with reference to FIGS. 1 and 2A to 2C, when an upper surface of the uppermost active layer is considered as a reference plane, a maximum depth of the recessed surface 27r of the first epitaxial region 27 may be about 5 nm to about 50 nm.

Figure 7:
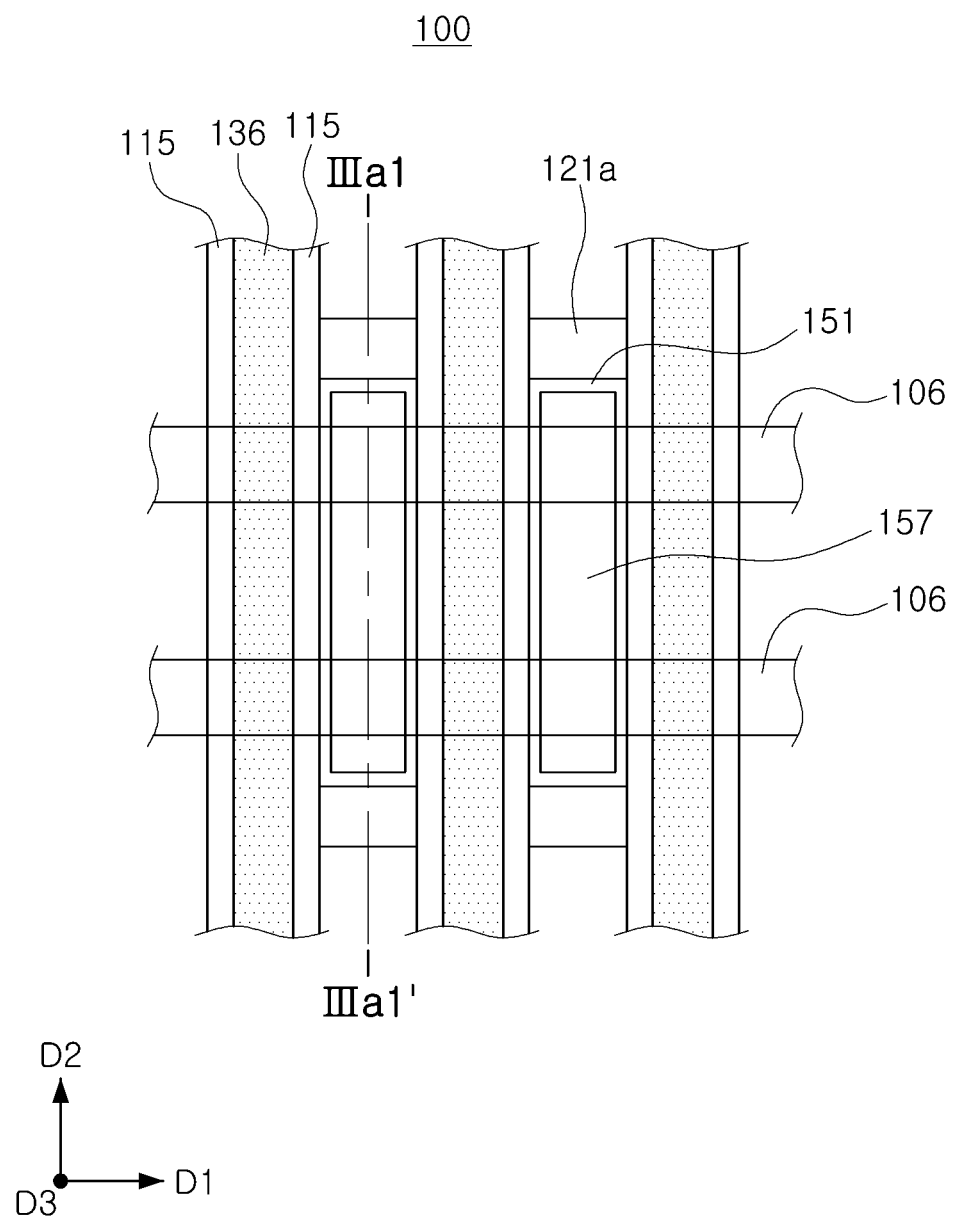
FIG. 7 is a plan view illustrating a modified example of a semiconductor device, according to example embodiments of the present disclosure.
Figure 8:
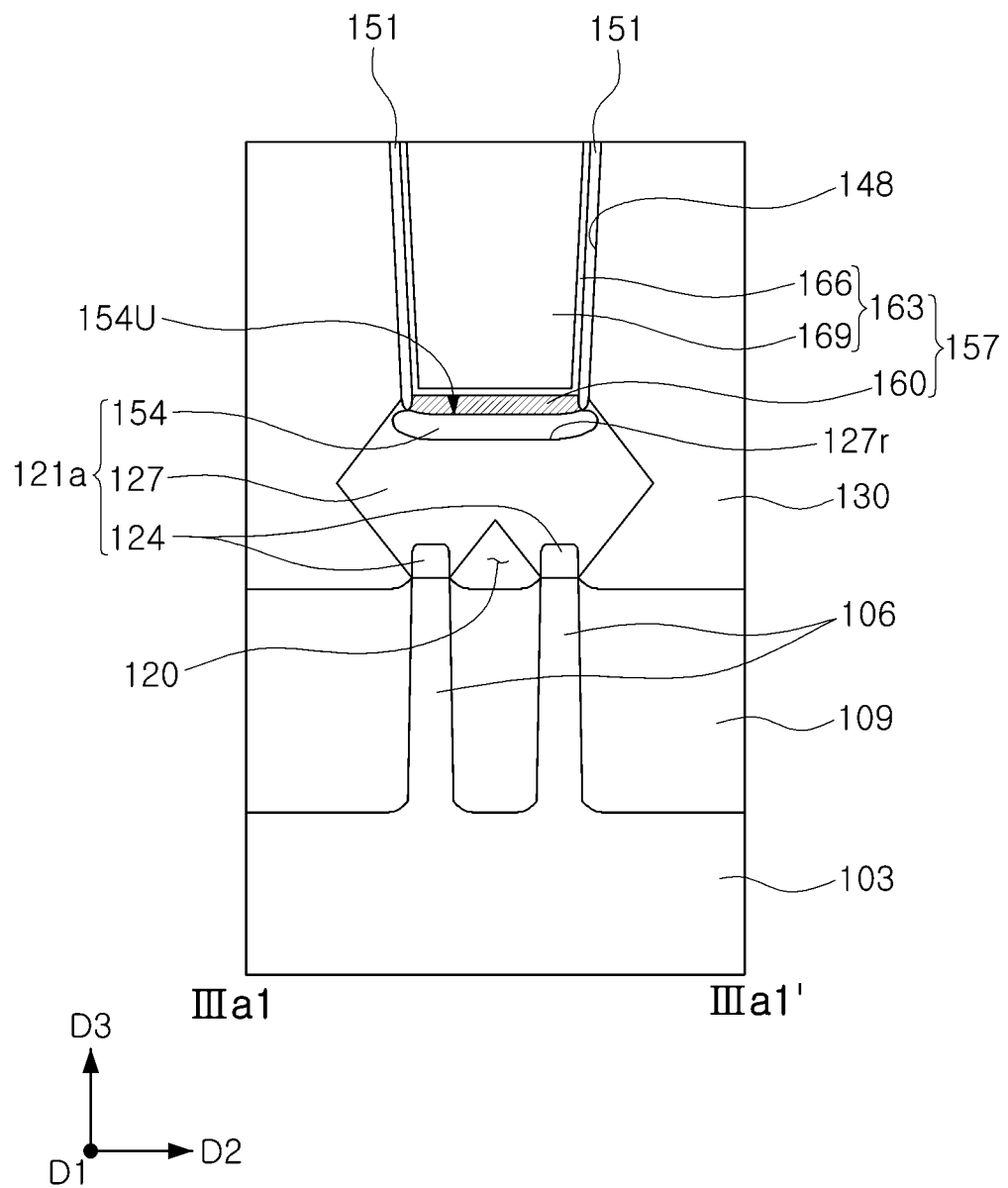
FIG. 8 is a cross-sectional view illustrating a modified example of a semiconductor device, according to example embodiments of the present disclosure.

Next, referring to FIGS. 7 and 8, a modified example of a semiconductor device according to an example embodiment of the present disclosure will be described. FIG. 7 is a plan view illustrating a modified example of a semiconductor device according to an example embodiment of the present disclosure, and FIG. 8 is a cross-sectional view illustrating a region taken along line IIIa1-IIIa1' of FIG. 7.

In a modified example, referring to FIGS. 7 and 8, a semiconductor device 100 may include a plurality of active regions 106, which may replace the active region (6 of FIGS. 1 to 2C) described with reference to FIGS. 1 to 2C.

In an example, the active regions 106 may be provided as two or more active regions.

Hereinafter, for convenience of description, an example will be mainly described, in which the active region 106 includes a pair of first and second active regions parallel to each other.

The semiconductor device 100 may include a gate structure 136 corresponding to the gate structure 36 as described with reference to FIGS. 1 to 2C.

The gate structure 136 may overlap the first active region and the second active region of the active regions 106, which are parallel to each other.

The gate structure 136 may be the same as the gate structure 36, described with reference to FIGS. 1 to 2C.

The semiconductor device 100 may further include an isolation layer 109 defining the active regions 106 on the semiconductor substrate 103. The semiconductor substrate 103 and the isolation layer 109 may be the same as the semiconductor substrate 3 and the isolation layer 9, respectively, as described with reference to FIGS. 1 to 2C.

The semiconductor device 100 may further include a gate spacer 115 on a side surface of the gate structure 136. The gate spacer 115 may be formed of the same material as the gate spacer 15, described with reference to FIGS. 1 to 2C.

The semiconductor device 100 may further include an interlayer insulating layer 130 on the isolation layer 109, a source/drain region 121a overlapping the first active region and the second active region of the active regions 106 and next to the gate structure 136, a contact plug 163 on the source/drain region 121a, and a contact spacer 151 surrounding a side surface of the contact plug 163. The contact plug 163 may be disposed in a contact hole 148 passing through the interlayer insulating layer 130. The interlayer insulating layer 130, the contact hole 148, and the contact spacer 151 may be formed of the same materials as the interlayer insulating layer 30, the contact hole 48, and the contact spacer 51, respectively, as described with reference to FIGS. 1 to 2C.

In the semiconductor device 100, a cross-sectional structure, cut in the first horizontal direction D1 based on the center of each of the active regions 106, may be the same as a cross-sectional structure cut along line Ia-Ia' of FIG. 1. Thus, in the semiconductor device 100, the cross-sectional structure, cut in the first horizontal direction D1 based on the center of each of the active regions 106, may be easily understood from the cross-sectional structure cut along line Ia-Ia' of FIG. 1, for example, a cross-sectional structure of FIG. 2A, so a description thereof will be omitted.

The source/drain region 121a may be formed of materials the same as the source/drain region 21a of FIGS. 2A to 2C. For example, the source/drain region 121a may include base epitaxial regions 124 formed on the first active region and the second active region of the active regions 106, which are parallel to and spaced apart from each other, a first epitaxial region 127 in contact with the base epitaxial regions 124, extending in the second horizontal direction D2 from a portion overlapping the first active region to a portion overlapping the second active region, and a second epitaxial region 154 grown epitaxially from a recessed surface 127r of the first epitaxial region 127. The second epitaxial region 154 may extend in the second horizontal direction D2 from a portion overlapping the first active region to a portion overlapping the second active region. For example, each of the first epitaxial region 127 and the second epitaxial region 154 may overlap both the first active region and the second active region in the vertical direction D3.

An air gap 120 may be formed between the first epitaxial region 127 and the isolation layer 109.

In an example, the lowest surface portion of an upper surface 254U of the second epitaxial region 254 may be located at a height level lower than a lower end of the contact spacer 151.

The contact plug 157 may be formed of materials the same as the contact structure 57 of FIGS. 2A to 2C. For example, the contact plug 157 may include a metal-semiconductor compound layer 160 in contact with the second epitaxial region 154 and a contact plug 163 on the metal-semiconductor compound layer 160. The contact plug 163 may include a first conductive layer 166 and a second conductive layer 169. The first conductive layer 166 may cover a lower surface and a side surface of the second conductive layer 169, contacting the lower and side surfaces of the second conductive layer 169.

Next, referring to FIGS. 9A to 9D, various modified examples of a semiconductor device according to an example embodiment of the present disclosure will be described. FIGS. 9A to 9D are cross-sectional views illustrating various modified examples of a cross-sectional structure of FIG. 8 to describe various modified examples of a semiconductor device, according to an example embodiment of the present disclosure.

Figure 9A:
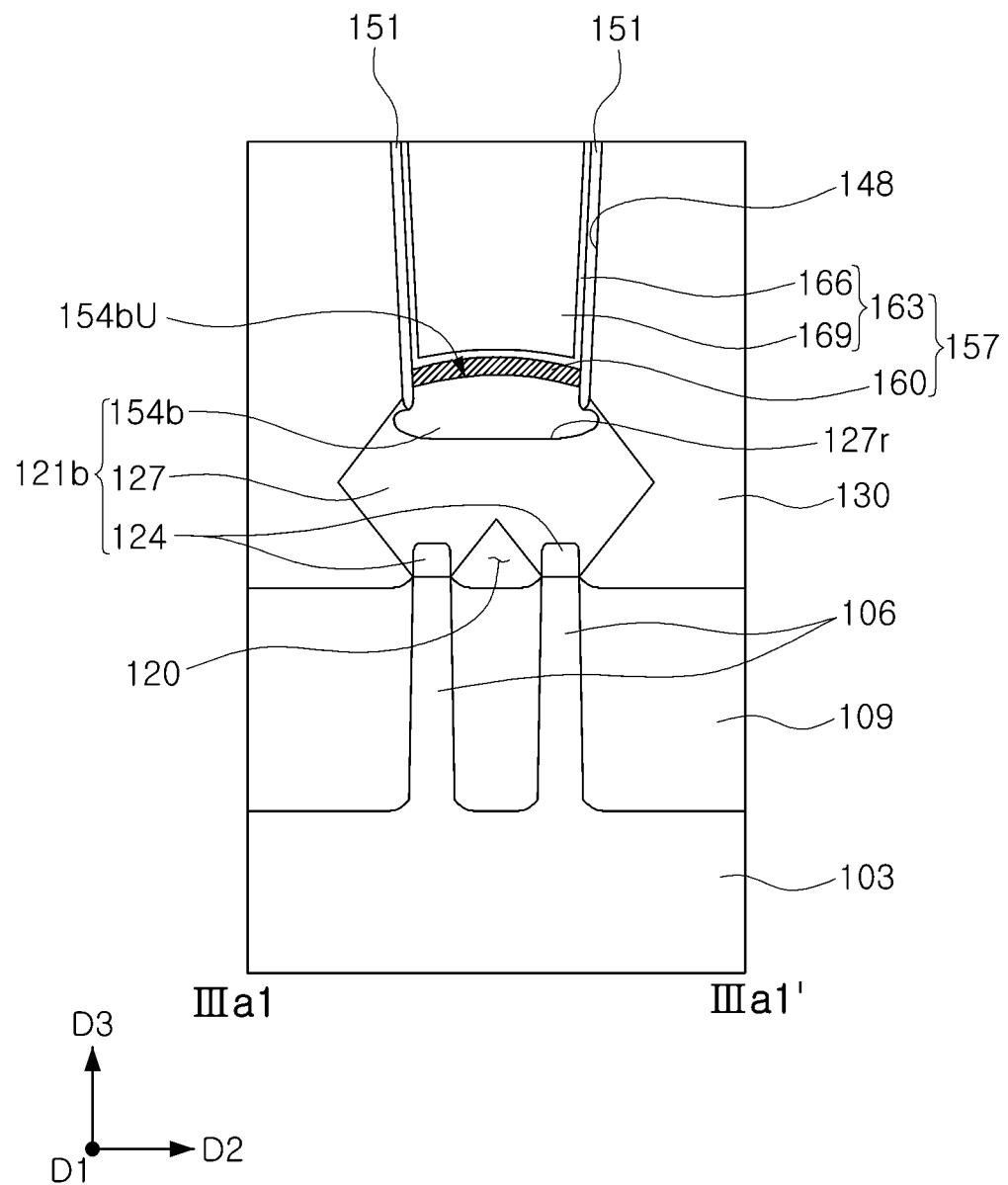
FIGS. 9A to 9D are cross-sectional views illustrating various modified examples of a semiconductor device, according to example embodiments of the present disclosure.

In a modified example, referring to FIG. 9A, a source/drain region 121b, which may replace the source/drain region 121a of FIG. 8, may be provided.

The source/drain region 121b may include the base epitaxial regions 124, the first epitaxial region 127 on the base epitaxial region 124, and a second epitaxial region 154b on the first epitaxial region 127.

The upper surface 154bU of the second epitaxial region 154b may be disposed at a height level higher than a lower end of the contact spacer 151. The upper surface 154bU of the second epitaxial region 154b may have a convex shape in the form of being upwardly rounded. In the second epitaxial region 154b, a maximum width of a portion located at a height level lower than a lower end of the contact spacer 151 may be greater than a maximum width of a portion located at a height level higher than a lower end of the contact spacer 151.

Figure 9B:
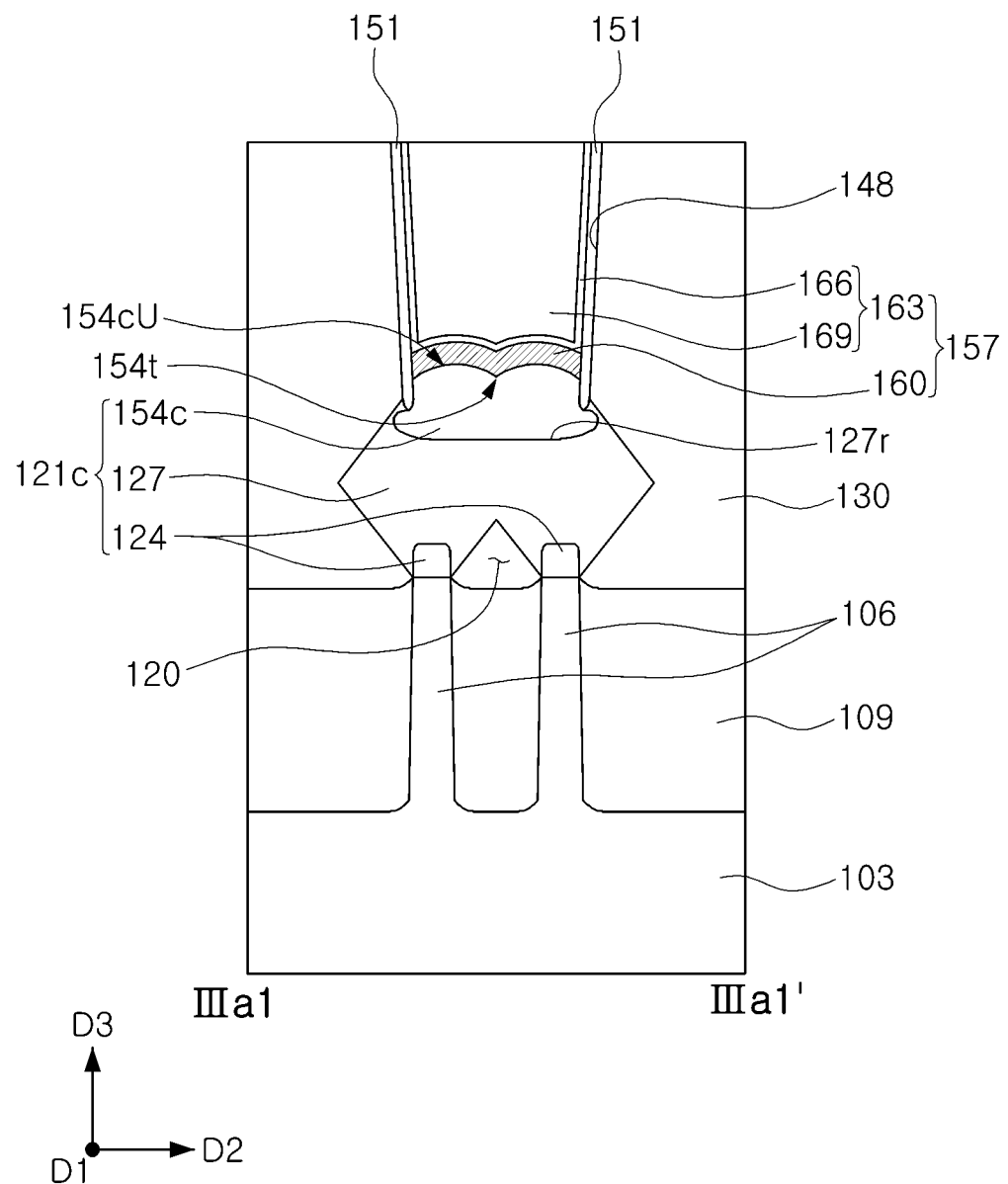

In a modified example, referring to FIG. 9B, a source/drain region 121c, which may replace the source/drain region 121a of FIG. 8, may be provided.

The source/drain region 121c may include the base epitaxial regions 124, the first epitaxial region 127 on the base epitaxial region 124, and a second epitaxial region 154c on the first epitaxial region 127.

The upper surface of the second epitaxial region 154c may be disposed at a height level higher than a lower end of the contact spacer 151. The upper surface of the second epitaxial region 154c may include convex portions 154cU in the upwardly rounded form and a concave portion 154t which is concave downwardly between the convex portions 154cU in the round form.

Figure 9C:
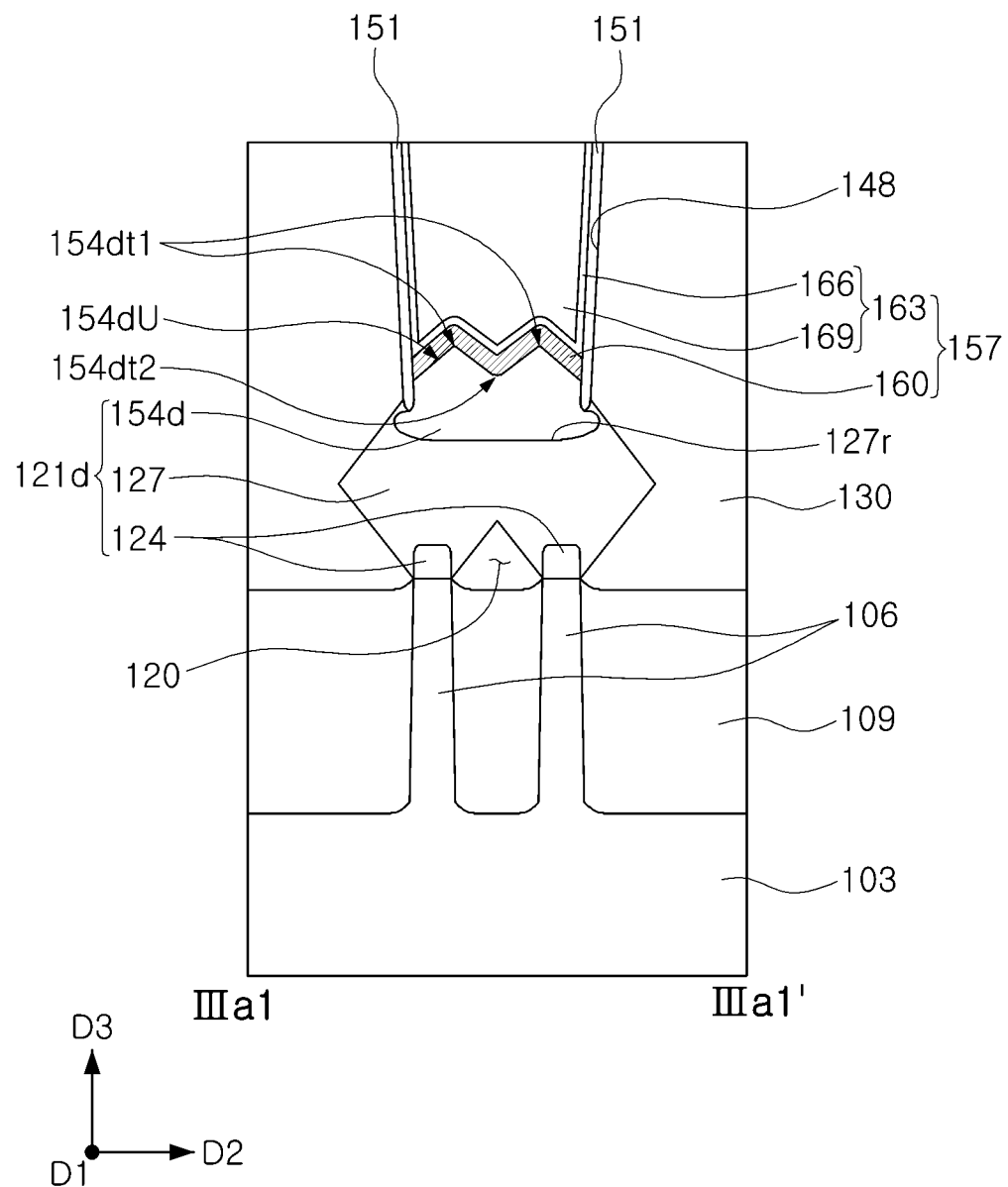

In a modified example, referring to FIG. 9C, a source/drain region 121d, which may replace the source/drain region 121a of FIG. 8, may be provided.

The source/drain region 121d may include the base epitaxial regions 124, the first epitaxial region 127 on the base epitaxial region 124, and a second epitaxial region 154d on the first epitaxial region 127.

The upper surface of the second epitaxial region 154d may be disposed at a height level higher than a lower end of the contact spacer 151. The upper surface of the second epitaxial region 154d may include portions pointed upwards. Thus, the upper surface of the second epitaxial region 154d may include inclined surfaces 154dU, portions 154dt1 pointed upwards where two inclined surfaces 154dU meet each other at upper positions, and a portion 154dt2 pointed downwardly where two inclined surfaces 154dU meet each other at a lower position.

Figure 9D:
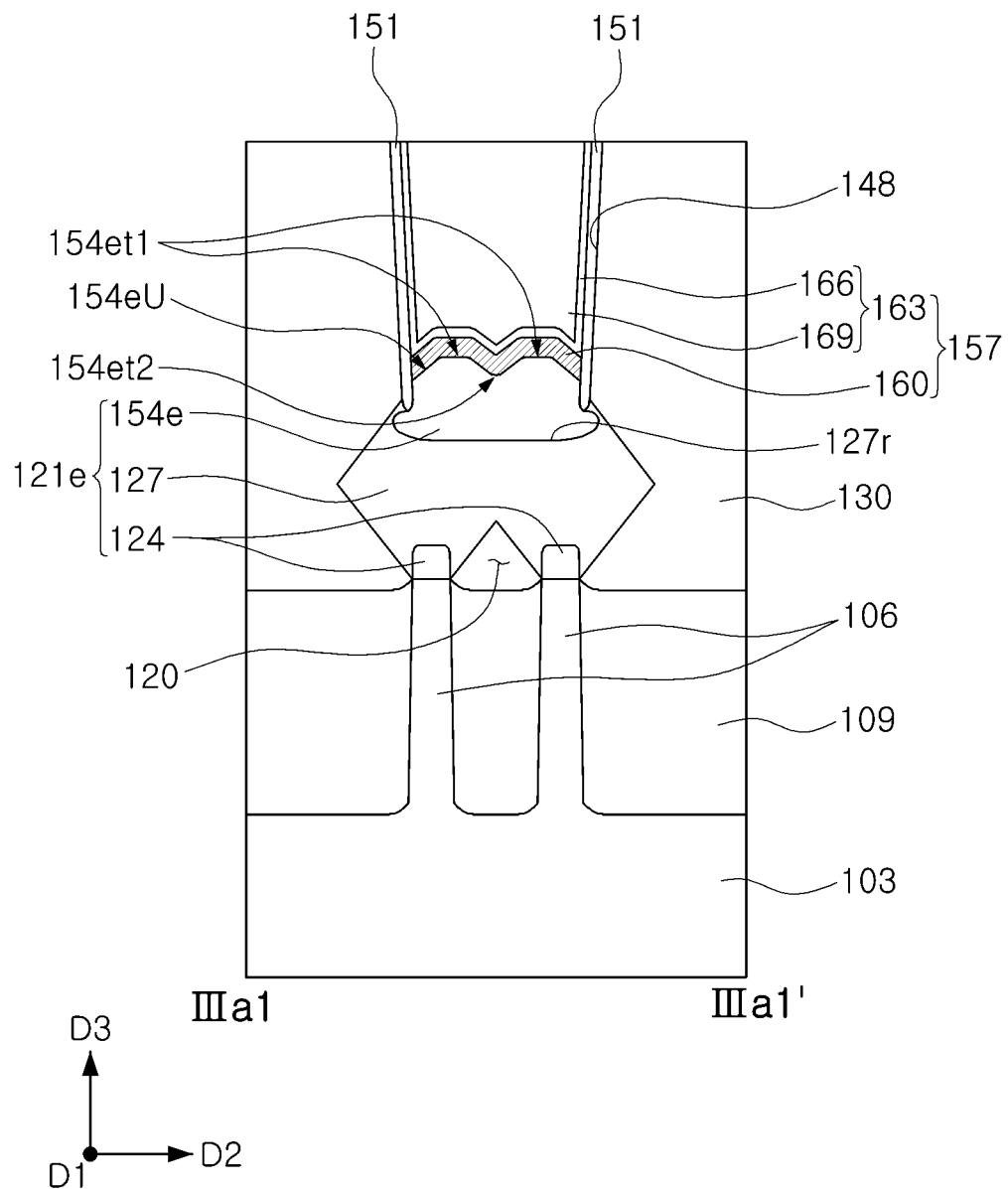

In a modified example, referring to FIG. 9D, a source/drain region 121e, which may replace the source/drain region 121a of FIG. 8, may be provided.

The source/drain region 121e may include the base epitaxial regions 124, the first epitaxial region 127 on the base epitaxial region 124, and a second epitaxial region 154e on the first epitaxial region 127.

The upper surface of the second epitaxial region 154e may be disposed at a height level higher than a lower end of the contact spacer 151. The upper surface of the second epitaxial region 154e may include flat upper ends 154et1 spaced apart from each other, inclined surfaces 154eU inclined downwardly from the flat upper ends 154e1, and a portion 154et2 pointed downwardly, and formed while inclined surfaces between the flat upper ends 154e1 meet each other.

Next, referring to FIGS. 10 and 11A to 11C, a modified example of a semiconductor device according to an example embodiment of the present disclosure will be described.

Figure 10:
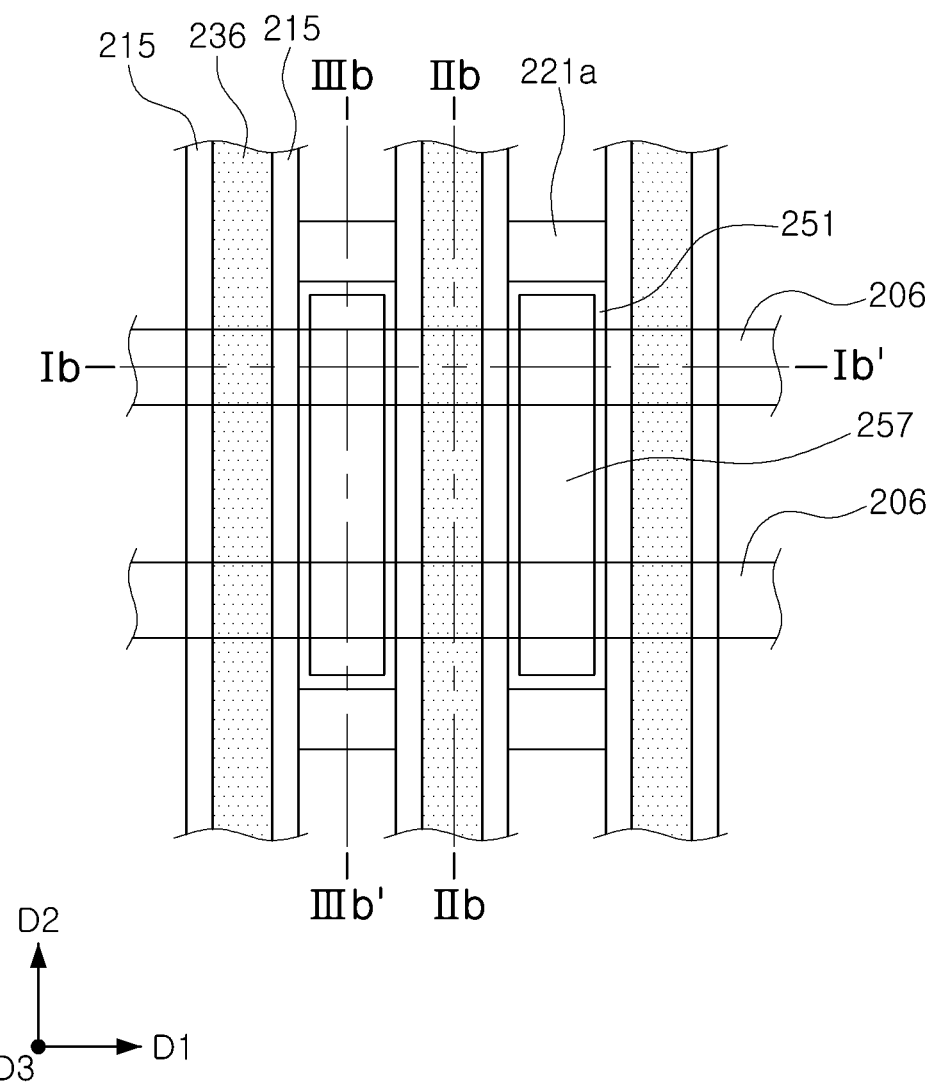
FIG. 10 is a plan view illustrating a modified example of a semiconductor device, according to example embodiments of the present disclosure.
Figure 11A:
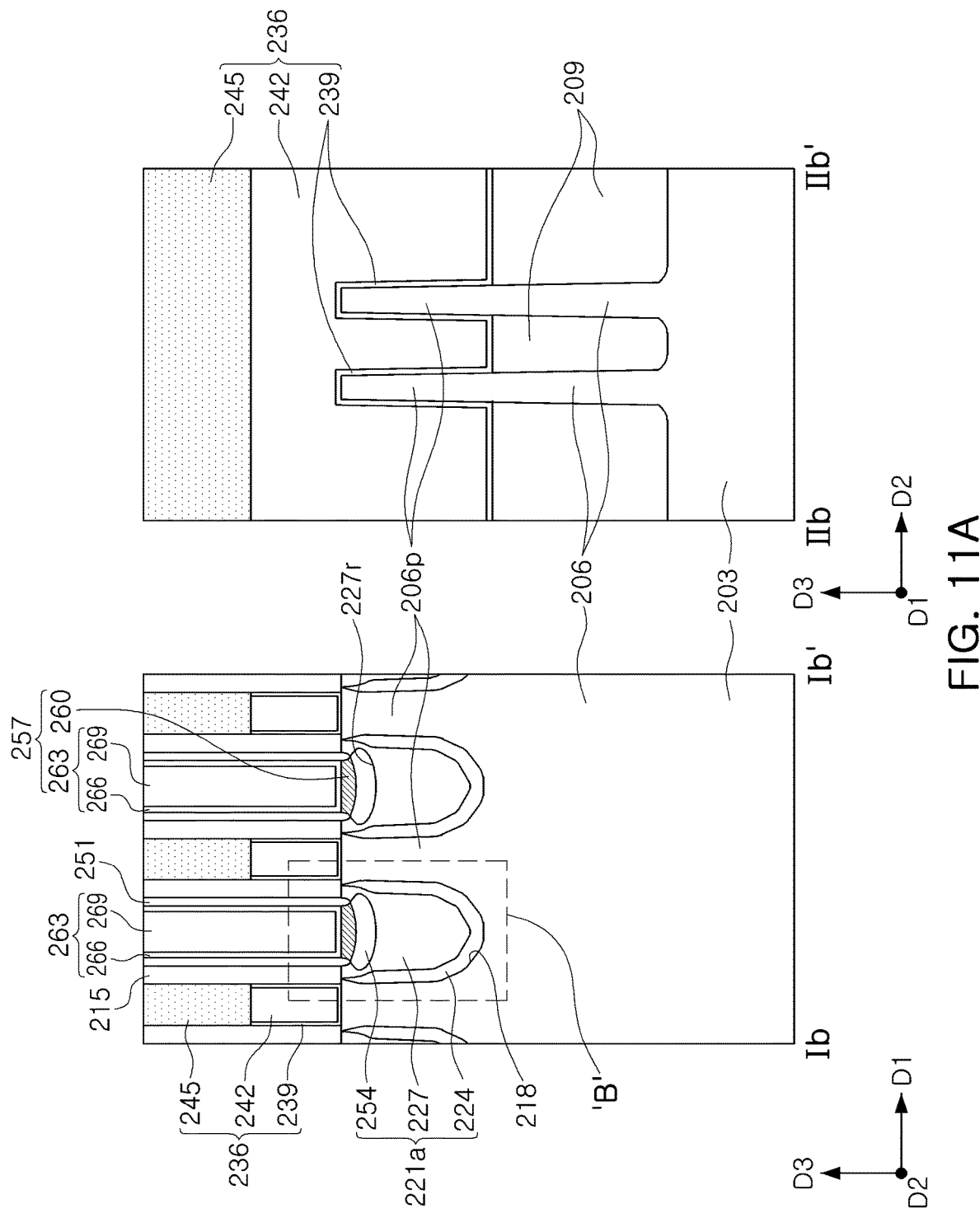
FIGS. 11A to 11C are diagrams illustrating a modified example of a semiconductor device, according to example embodiments of the present disclosure.
Figure 11B:
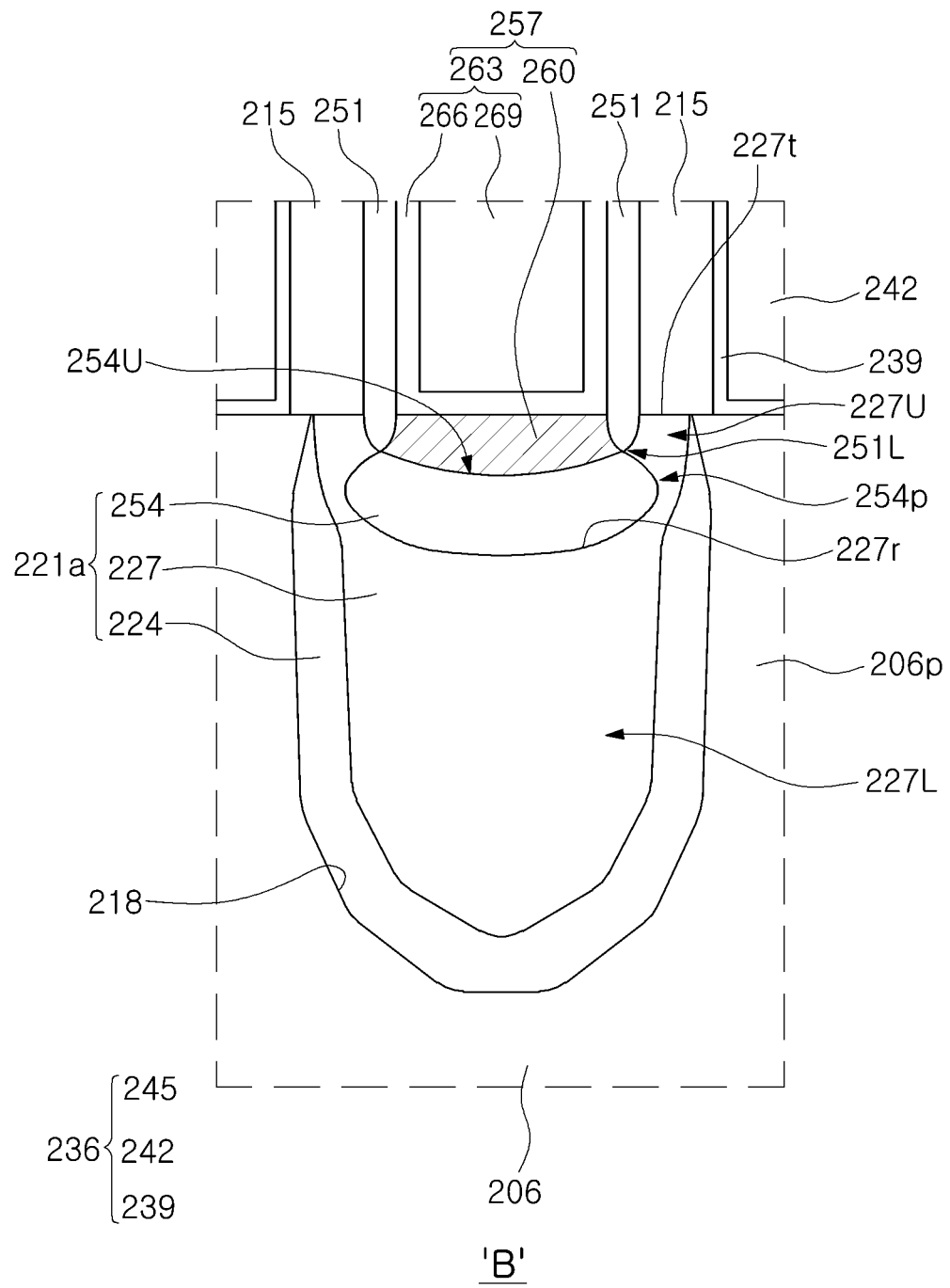
Figure 11C:
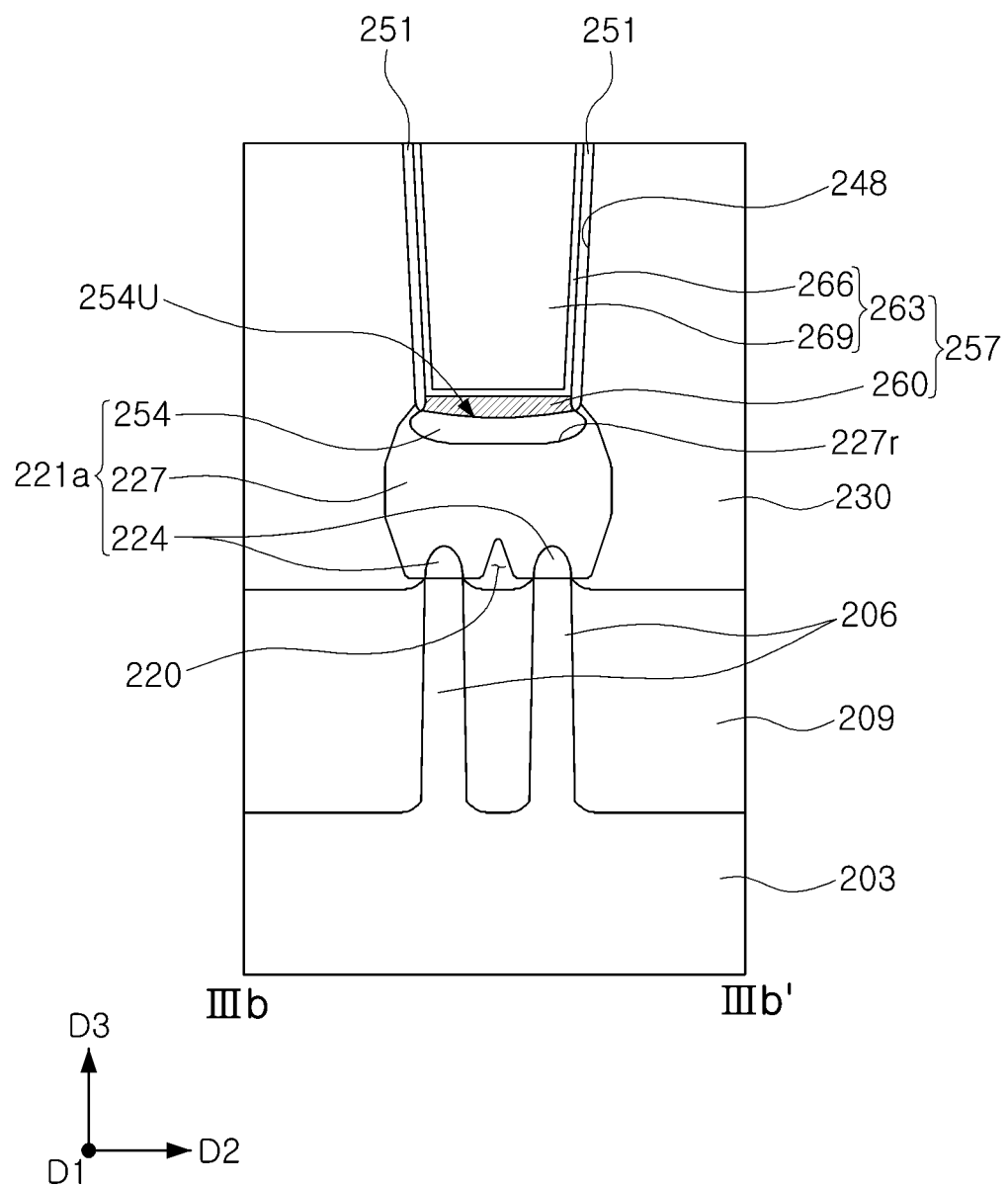

FIG. 10 is a plan view illustrating a modified example of a semiconductor device according to example embodiments of the present disclosure, FIG. 11 is a cross-sectional view illustrating a region taken along line Ib-Ib' and a region taken along line IIb-IIb' of FIG. 10 to describe a modified example of a semiconductor device according to an example embodiment of the present disclosure, FIG. 11B is a partially enlarged view in which a portion indicated by 'A' of FIG. 11A is enlarged, and FIG. 11C is a cross-sectional view illustrating a region taken along line IIIb-IIIb' of FIG. 10 to describe a semiconductor device according to an example embodiment of the present disclosure.

Referring to FIGS. 10 to 11C, a semiconductor device 200 may include a semiconductor substrate 203, an active region 206 and an isolation layer 209, on the semiconductor substrate 203, and a channel region 206p and a source/drain region 221a, on the active region 206.

In an example, the active region 206 may be provided as a single active region (see, e.g., active region 6 of FIG. 1), or a plurality of active regions (see, e.g., active regions 106 of FIG. 7). Hereinafter, the case in which the active region 206 is provided as a plurality of active regions will mainly be described.

The isolation layer 209 may be a trench isolation layer defining the active regions 206. The semiconductor substrate 203 and the isolation layer 209 may be formed of the same materials as the semiconductor substrate 3 and the isolation layer 9, respectively, as described with reference to FIGS. 1 to 2C.

In an example, the channel region 206p may be extended from each of the active regions 206 in the vertical direction D3. Thus, the channel region 206p may be provided as a plurality of channel regions.

When the channel regions 206p are a channel region of an NMOS transistor, the channel region 6p may have P-type conductivity, and the source/drain region 221a may have N-type conductivity.

The semiconductor device 200 may include a gate structure 236, a gate spacer 215, an interlayer insulating layer 230, a contact hole 248, a contact structure 257, and a contact spacer 251 corresponding to, and formed of the same materials as, the gate structure 36, the gate spacer 15, the interlayer insulating layer 30, the contact hole 48, the contact structure 57, and the contact spacer 51, respectively, as described with reference to FIGS. 1 to 2C. For example, the contact structure 257 may include a metal-semiconductor compound layer 260 and a contact plug 263 including the first and second conductive layers 266 and 269, corresponding to the metal-semiconductor compound layer 60 and the contact plug 63 including the first and second conductive layers 66 and 69, respectively, as described with reference to FIGS. 1 to 2C. The metal-semiconductor compound layer 260 may have a thickness in the vertical direction D3 of about 1 nm to about 10 nm.

The semiconductor device 200 may include a source/drain region 221a which may replace the source/drain region 21a described with reference to FIGS. 1 to 2C.

An air gap 220 may be disposed between the source/drain region 221a and isolation layer 209 in the region between the active regions 206.

The source/drain region 221a may include base epitaxial regions 224 formed on the first active region and the second active region of the active regions 206, which are parallel to each other and spaced apart from each other, a first epitaxial region 227 in contact with the base epitaxial regions 224, extending in the second horizontal direction D2 from a portion overlapping the first active region to a portion overlapping the second active region, and a second epitaxial region 254 grown epitaxially from a recessed surface 227r of the first epitaxial region 227. The second epitaxial region 254 may extend in the second horizontal direction D2 from a portion overlapping the first active region to a portion overlapping the second active region. For example, each of the first epitaxial region 227 and the second epitaxial region 254 may overlap both the first active region and the second active region in the vertical direction D3.

The air gap 220 may be formed between the first epitaxial region 127 and the isolation layer 109.

The source/drain region 221a will be mainly described with reference to FIG. 11B.

Referring to FIG. 11B, the source/drain region 221a may be disposed in a recess region 218 in the active region 206 and the channel region 206p.

The source/drain region 221a may include N-type impurities such as phosphorus (P), arsenic (As), or the like. The N-type impurities in the source/drain region 221a may be a concentration of 1E17 to 1E22 atom/cc.

The source/drain region 221a may be a Si epitaxial layer. In another example, the source/drain region 221a may be a Si epitaxial layer including stibium (Sb) or carbon (C).

The base epitaxial region 224 may have a thickness reduced toward an upper surface of the channel region 206p. Here, thickness may refer to the distance from an outer surface of the base epitaxial region 224 (e.g., a surface in contact with the channel region 206p) to an inner surface of the base epitaxial region 224 (e.g., a surface in contact with the first epitaxial region 227). The base epitaxial region 224 may have a thickness in the vertical direction D3 of about 1 nm to about 40 nm below a lower surface of the first epitaxial region 227.

In an example, the base epitaxial region 224 may be omitted.

In an example, the first epitaxial region 227 may have a thickness in the vertical direction D3 of about 1 nm to about 50 nm.

In an example, the second epitaxial region 254 may have a thickness in the vertical direction D3 of about 1 nm to about 50 nm.

In an example, an impurity concentration in the second epitaxial region 254 may be higher than an impurity concentration in the first epitaxial region 227.

In an example, an impurity concentration in the first epitaxial region 227 may be higher than an impurity concentration in the base epitaxial region 224.

In an example, when an upper surface of the channel region 206p or a lower surface of the gate spacer 215 is considered as a reference plane, a maximum depth of a recessed surface 227r of the first epitaxial region 227 may be about 5 nm to about 50 nm. For example, the maximum depth of the recessed surface 227r may be about 5 nm to about 50 nm below the reference plane defined by the lower surface of the gate spacer 215 or the upper surface of the channel region 206p.

The second epitaxial region 254 may include an extended portion 254p extending in the first horizontal direction D1 from a portion overlapping the contact structure 257 to a portion overlapping the contact spacer 251. For example, the extended portion 254p of the second epitaxial region 254 may overlap the contact structure 257 and the contact spacer 251 in the vertical direction D3.

The extended portion 254p of the second epitaxial region 254 may overlap the gate spacer 215 in the vertical direction D3. The extended portion 254p of the second epitaxial region 254 may be spaced apart from the gate spacer 215. The second epitaxial region 254 may be in contact with a lower end 251L of the contact spacer 251.

The first epitaxial region 227 may include a first lower epitaxial region 227L positioned below the extended portion 254p of the second epitaxial region 254 and a first upper epitaxial region 227U positioned above the extended portion 254p of the second epitaxial region 254. For example, the first lower epitaxial region 227L may be the portion of the first epitaxial region 227 that is formed at a vertical level lower than the extended portion 254p, and the first upper epitaxial region 227U may be the portion of the first epitaxial region 227 that is formed at a vertical level the same as or higher than the extended portion 254p. The first lower epitaxial region 227L and the first upper epitaxial region 227U may be connected to each other. For example, the first lower epitaxial region 227L and the first upper epitaxial region 227U may be in material continuity with one another. An upper end 227t of the first epitaxial region 227 may be in contact with a lower surface of the gate spacer 215.

In an example, the lowest surface portion of an upper surface 254U of the second epitaxial region 254 may be located at a height level lower than a lower end of the contact spacer 251. The upper surface 254U of the second epitaxial region 254 may be disposed at a height level lower than an upper surface of the channel region 206p.

Next, referring to FIGS. 12A to 12D, various modified examples of a semiconductor device according to an example embodiment of the present disclosure will be described. FIGS. 12A to 12D are partially enlarged views corresponding to a region, in which a portion indicated by 'B' of FIG. 11A is enlarged, to describe various modified examples of a semiconductor device according to an example embodiment of the present disclosure.

Figure 12A:
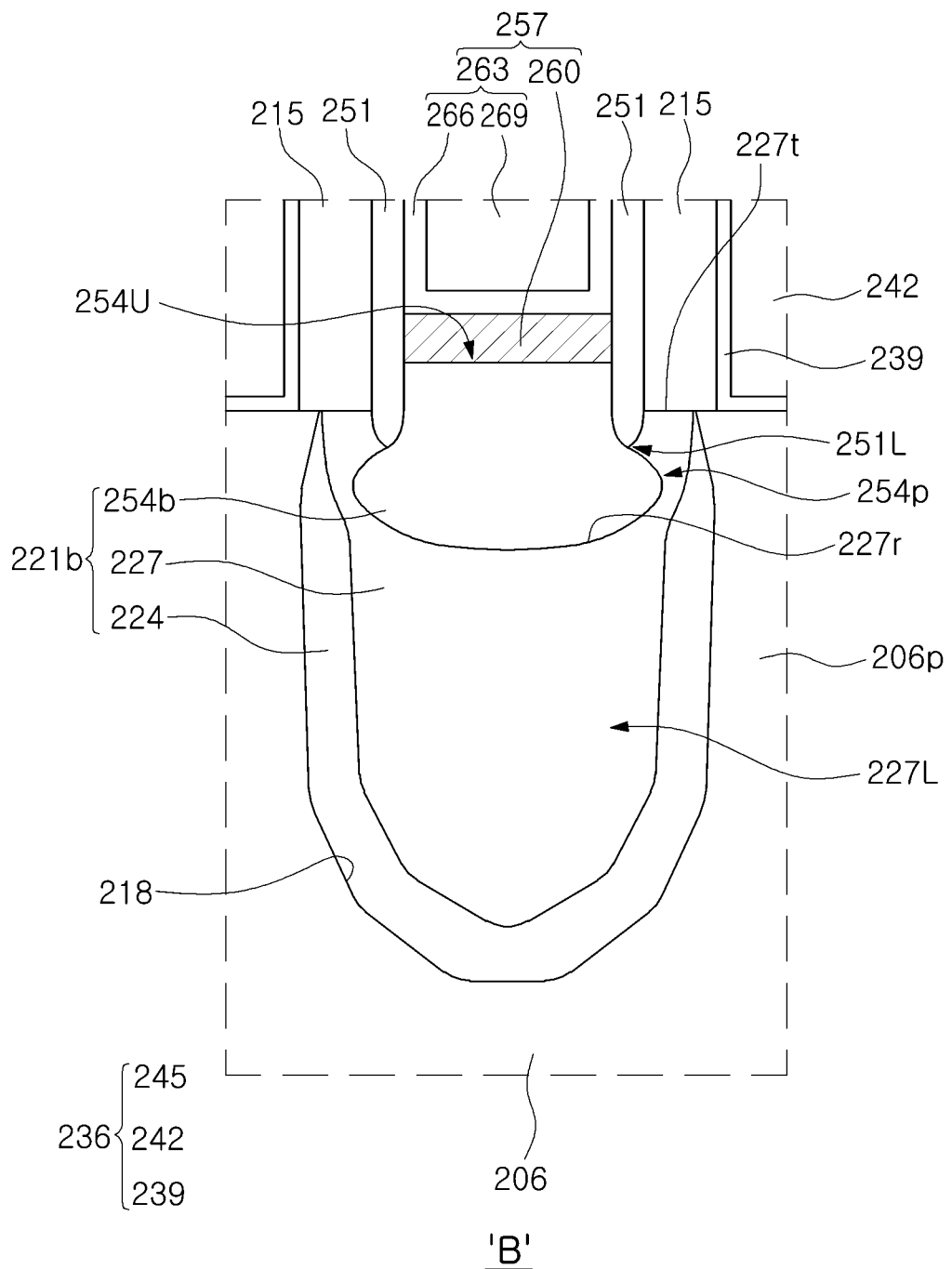
FIGS. 12A to 12C are cross-sectional views illustrating various modified examples of a semiconductor device, according to example embodiments of the present disclosure.

In a modified example, referring to FIG. 12A, a source/drain region 221b, which may replace the source/drain region 221a of FIG. 11B, may be provided.

The source/drain region 221b may include the base epitaxial region 224, a first epitaxial region 227 on the base epitaxial region 224, and a second epitaxial region 254b on the first epitaxial region 227.

The upper surface 254U of the second epitaxial region 254b may be disposed at a height level higher than an upper surface of the channel region 206p.

Figure 12B:
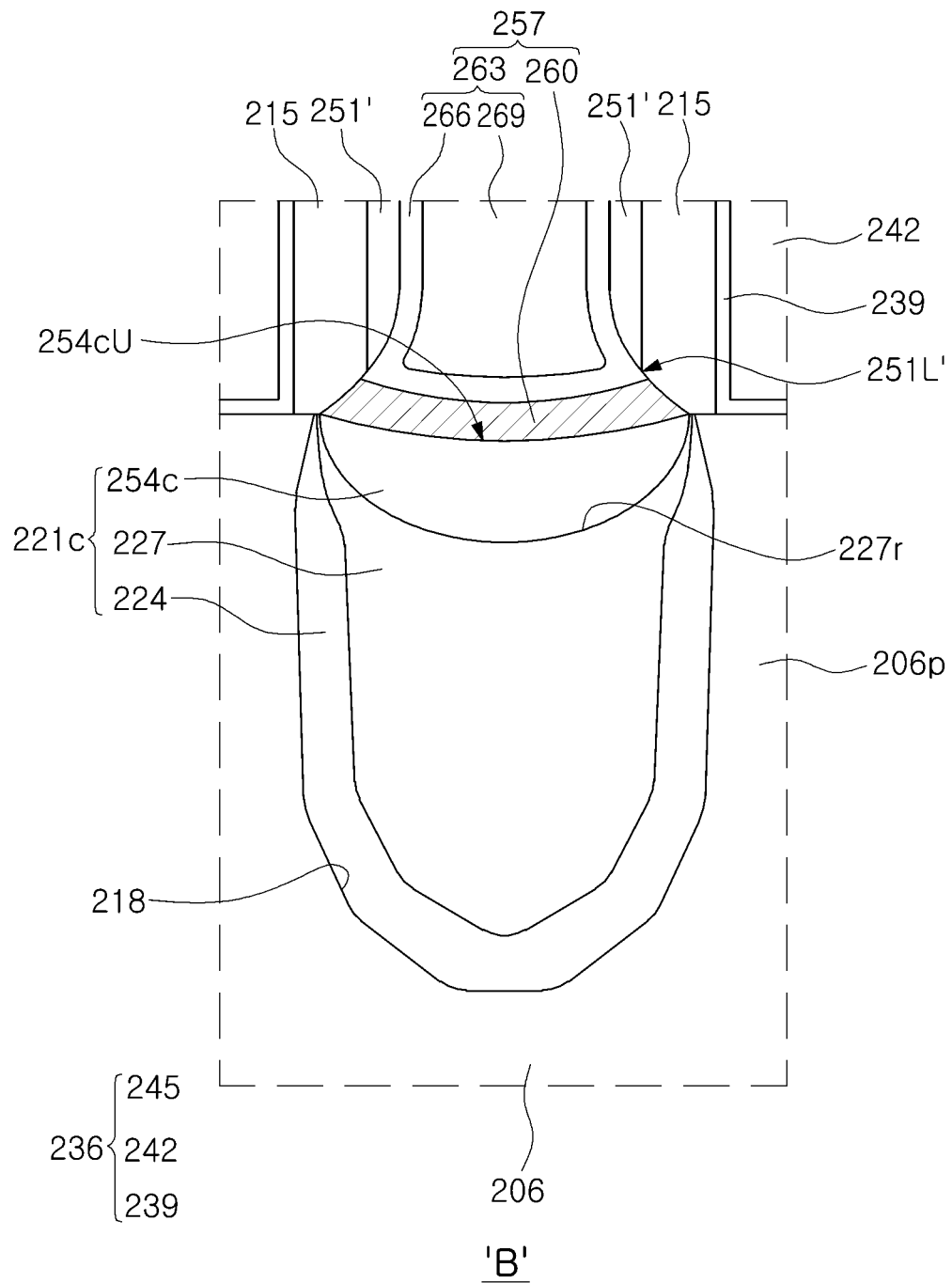

In a modified example, referring to FIG. 12B, a source/drain region 221c and a contact spacer 251', which may replace the source/drain region 221a and the contact spacer 251 of FIG. 11B, respectively, may be provided.

A lower end 251L' of the contact spacer 251' may be placed at a height level higher than a lower surface of the gate spacer 215.

The source/drain region 221c may include the base epitaxial region 224, a first epitaxial region 227 on the base epitaxial region 224, and a second epitaxial region 254c on the first epitaxial region 227.

The upper surface 254cU of the second epitaxial region 254c may be disposed at a height level lower than an upper surface of the channel region 206p.

Figure 12C:
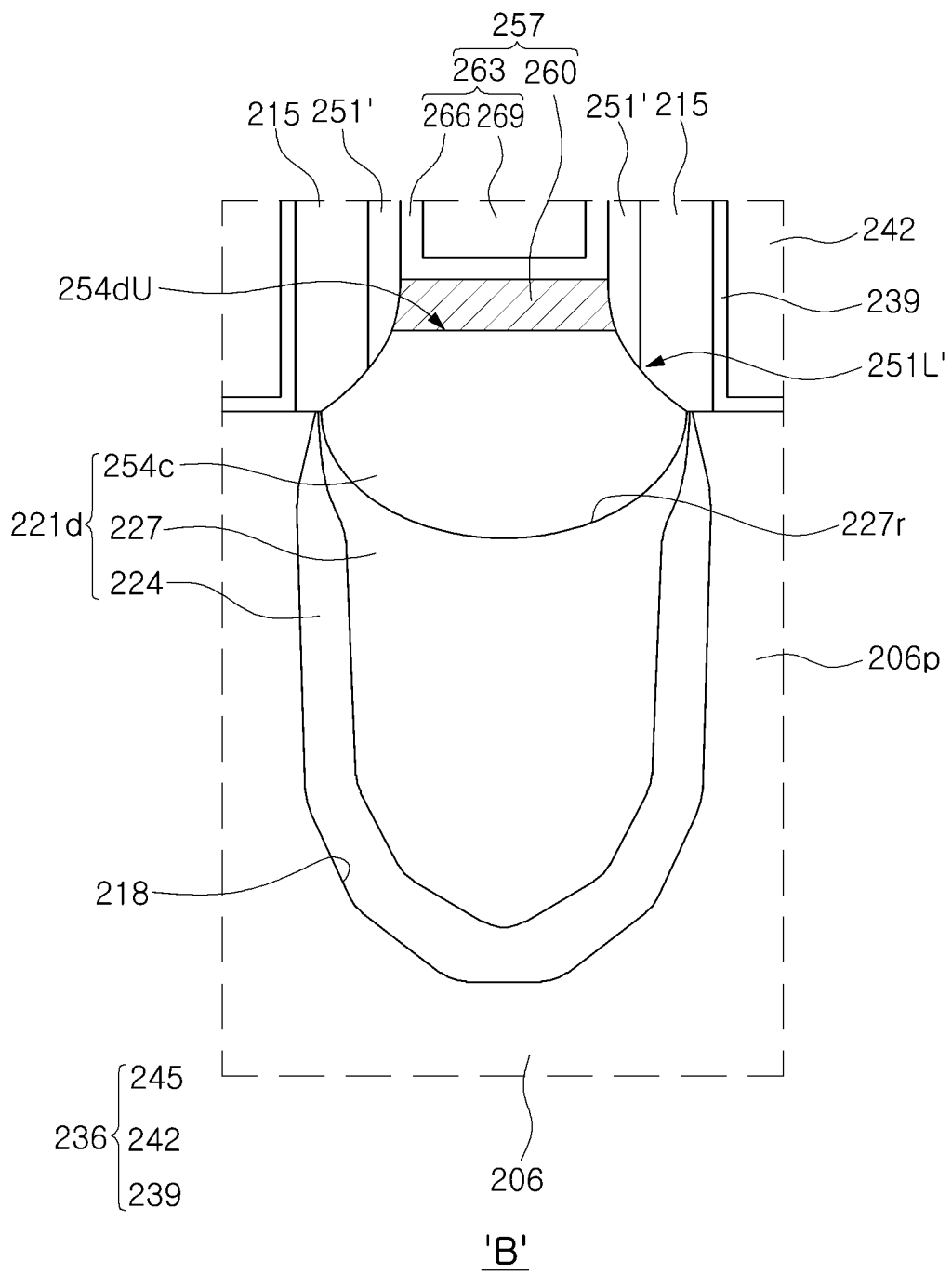

In a modified example, referring to FIG. 12C, together with the contact spacer 251' of FIG. 12B, a source/drain region 221d which may replace the source/drain region 221a of FIG. 11B, may be provided.

The source/drain region 221d may include the base epitaxial region 224, a first epitaxial region 227 on the base epitaxial region 224, and a second epitaxial region 254d on the first epitaxial region 227. The upper surface 254dU of the second epitaxial region 254d may be disposed at a height level higher than an upper surface of the channel region 206p.

Figure 13:
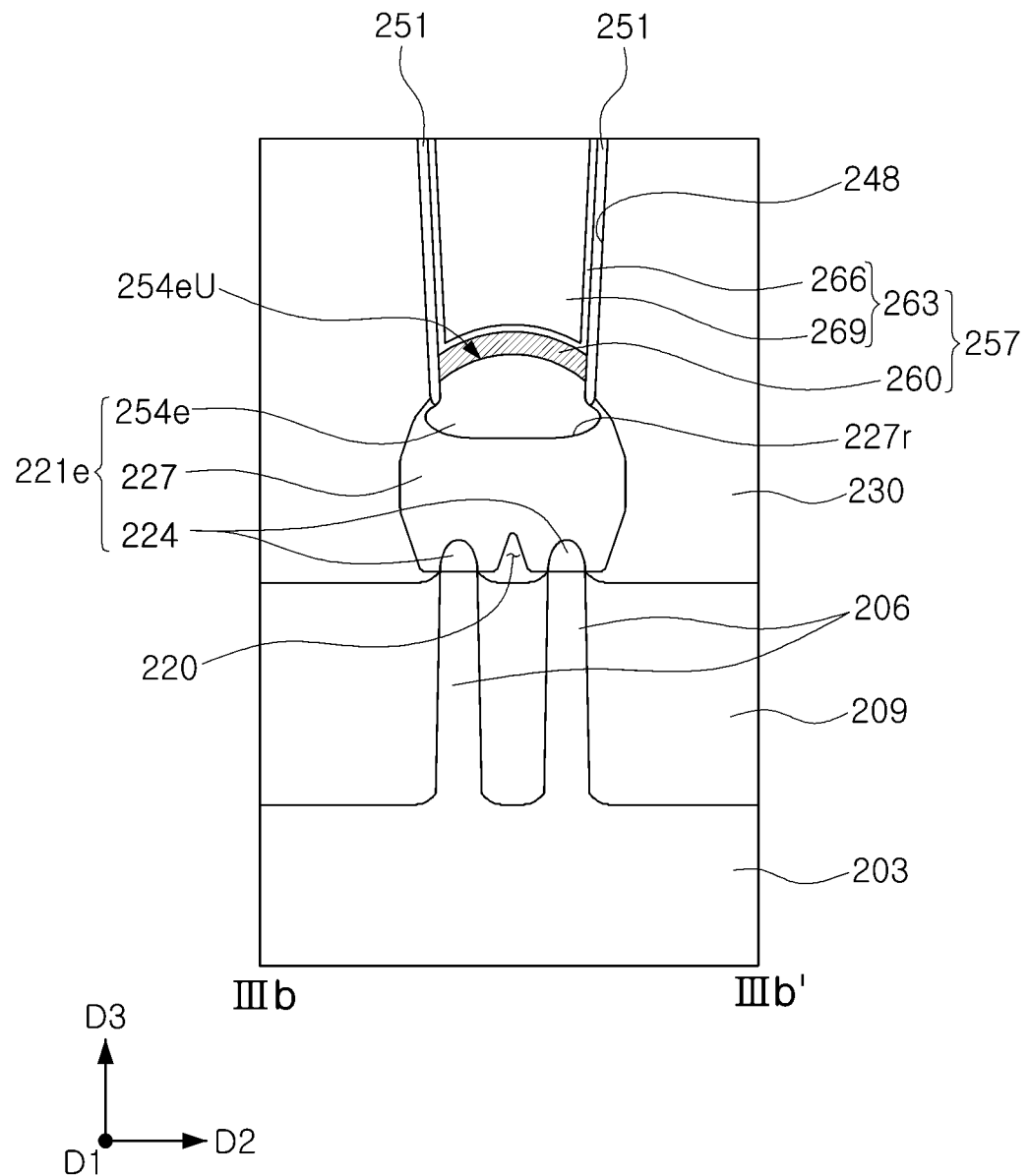
FIG. 13 is a cross-sectional view illustrating a modified example of a semiconductor device, according to example embodiments of the present disclosure.

Next, referring to FIG. 13, various modified examples of a semiconductor device according to an example embodiment of the present disclosure will be described. FIG. 13 is a cross-sectional view illustrating a modified example of a cross-sectional structure of FIG. 11C to describe a modified example of a semiconductor device according to an example embodiment of the present disclosure.

Referring to FIG. 13, a source/drain region 221e, which may replace the source/drain region 221a of FIG. 11C, may be provided.

The source/drain region 221e may include the base epitaxial region 224, a first epitaxial region 227 on the base epitaxial region 224, and a second epitaxial region 254e on the first epitaxial region 227.

The upper surface 254eU of the second epitaxial region 254e may be disposed at a height level higher than a lower end of the contact spacer 251. The upper surface 254eU of the second epitaxial region 254e may have a convex shape in the form of being upwardly rounded. In the second epitaxial region 254e, a maximum width of a portion located at a height level lower than a lower end of the contact spacer 251 may be greater than a maximum width of a portion located at a height level higher than a lower end of the contact spacer 251.

Figure 14:
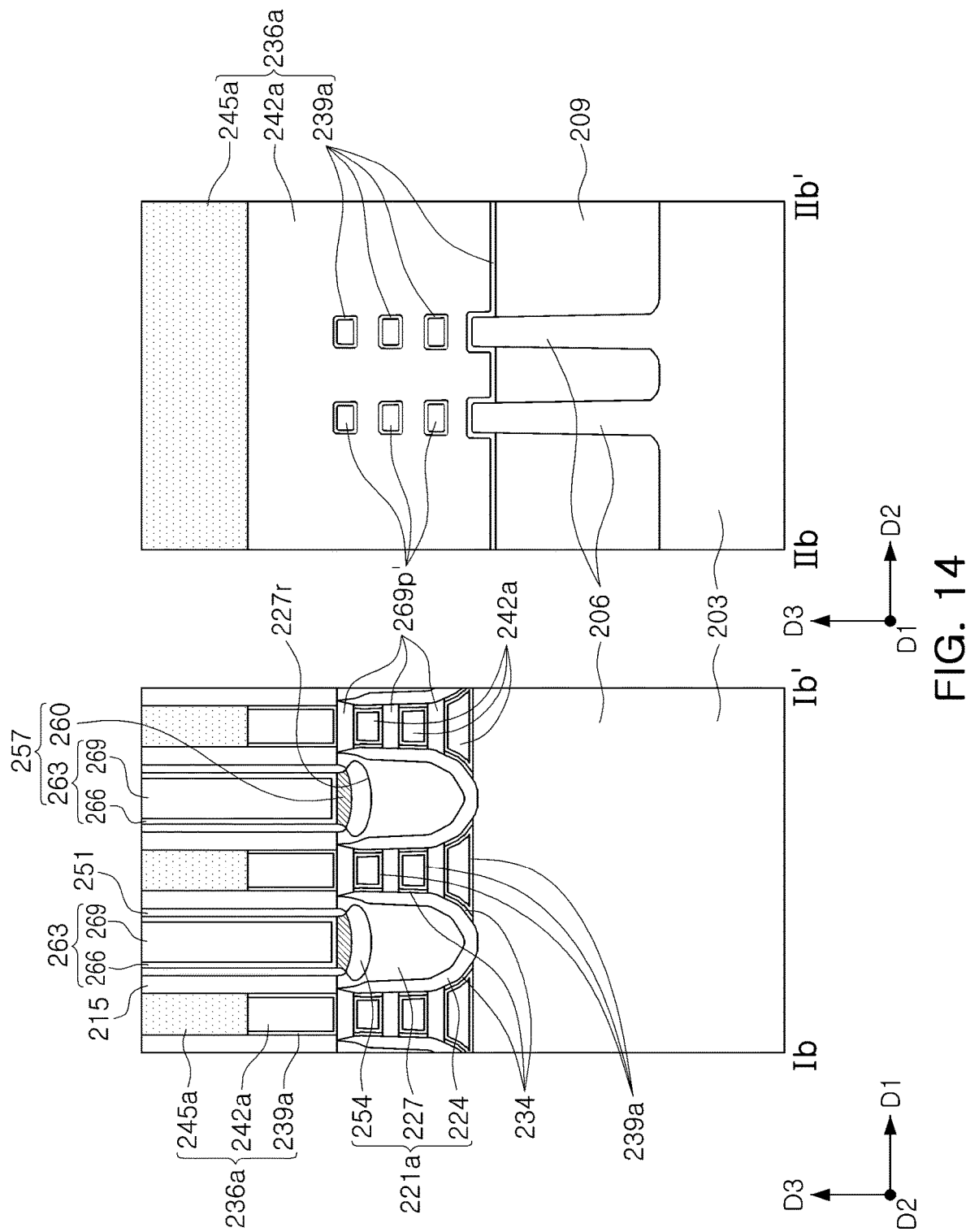
FIG. 14 is a cross-sectional view illustrating a modified example of a semiconductor device, according to example embodiments of the present disclosure.

Next, referring to FIG. 14, a modified example of a semiconductor device according to an example embodiment of the present disclosure will be described. FIG. 14 includes cross-sectional views illustrating various modified examples of a cross-sectional structure of FIG. 11A to describe various modified examples of a semiconductor device according to an example embodiment of the present disclosure.

In a modified example, referring to FIG. 14, the channel region 206p of FIG. 1A may be replaced with a plurality of active layers 206p' stacked while being spaced apart from each other in the vertical direction D3 on the active region 206. A gate structure 236a, which may replace the gate structure 236 of FIG. 11A, may be provided.

The gate structure 236a may be extended in the second horizontal direction D2 while covering an upper surface, a side surface, and a lower surface of each of the plurality of active layers 206p'.

The gate structure 236a may include a gate dielectric layer 239a, a gate electrode 242a, and a gate capping layer 245a. The gate dielectric layer 239a, the gate electrode 242a, and the gate capping layer 245a may correspond to the gate dielectric layer 39a, the gate electrode 42a, and the gate capping layer 45a, respectively, as described with reference to FIG. 6.

In an example, an inner insulating spacer 234, interposed between the source/drain region 221a, and the gate dielectric layer 239a, located below each of the plurality of active layers 206p', may be further included. The inner insulating spacer 234 may be omitted.

Figure 15:
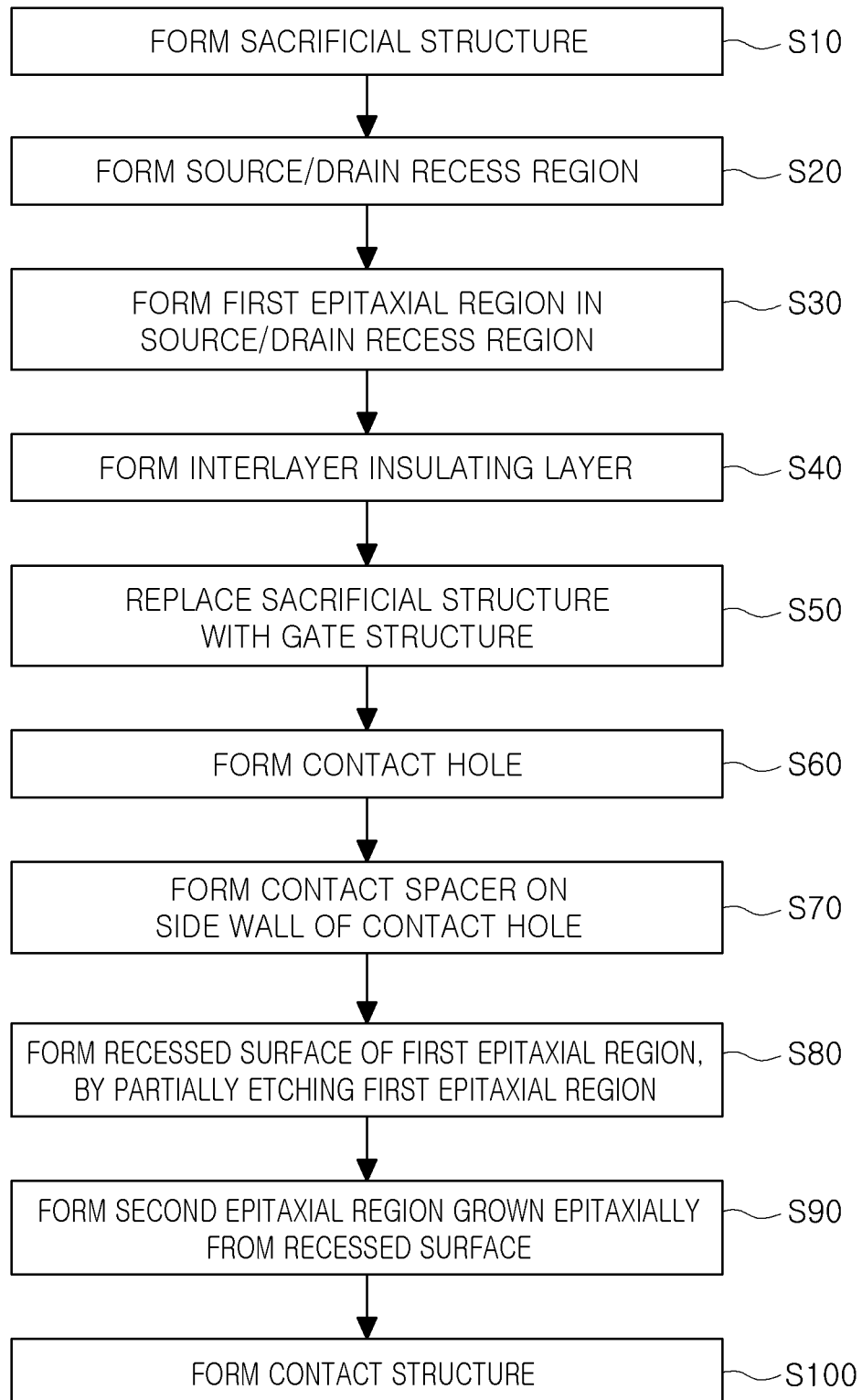
FIG. 15 is a process flow diagram illustrating a method of manufacturing a semiconductor device, according to example embodiments of the present disclosure.

Next, a method of forming a semiconductor device according to example embodiments of the present disclosure will be described. FIG. 15 is a process flow diagram illustrating a method of forming a semiconductor device according to example embodiments of the present disclosure, and FIGS. 16A to 18B are cross-sectional views illustrating a method of forming a semiconductor device according to an example embodiment of the present disclosure. In FIGS. 16A to 18B, FIGS. 16A, 17A, and 18A are cross-sectional views illustrating a region taken along line Ia-Ia' and a region taken along line IIa-IIa', of FIG. 1, and FIGS. 16B, 17B, and 18B are cross-sectional views illustrating a region taken along line IIIa-IIIa' of FIG. 1 to describe a semiconductor device, according to an example embodiment of the present disclosure.

Figure 16A:
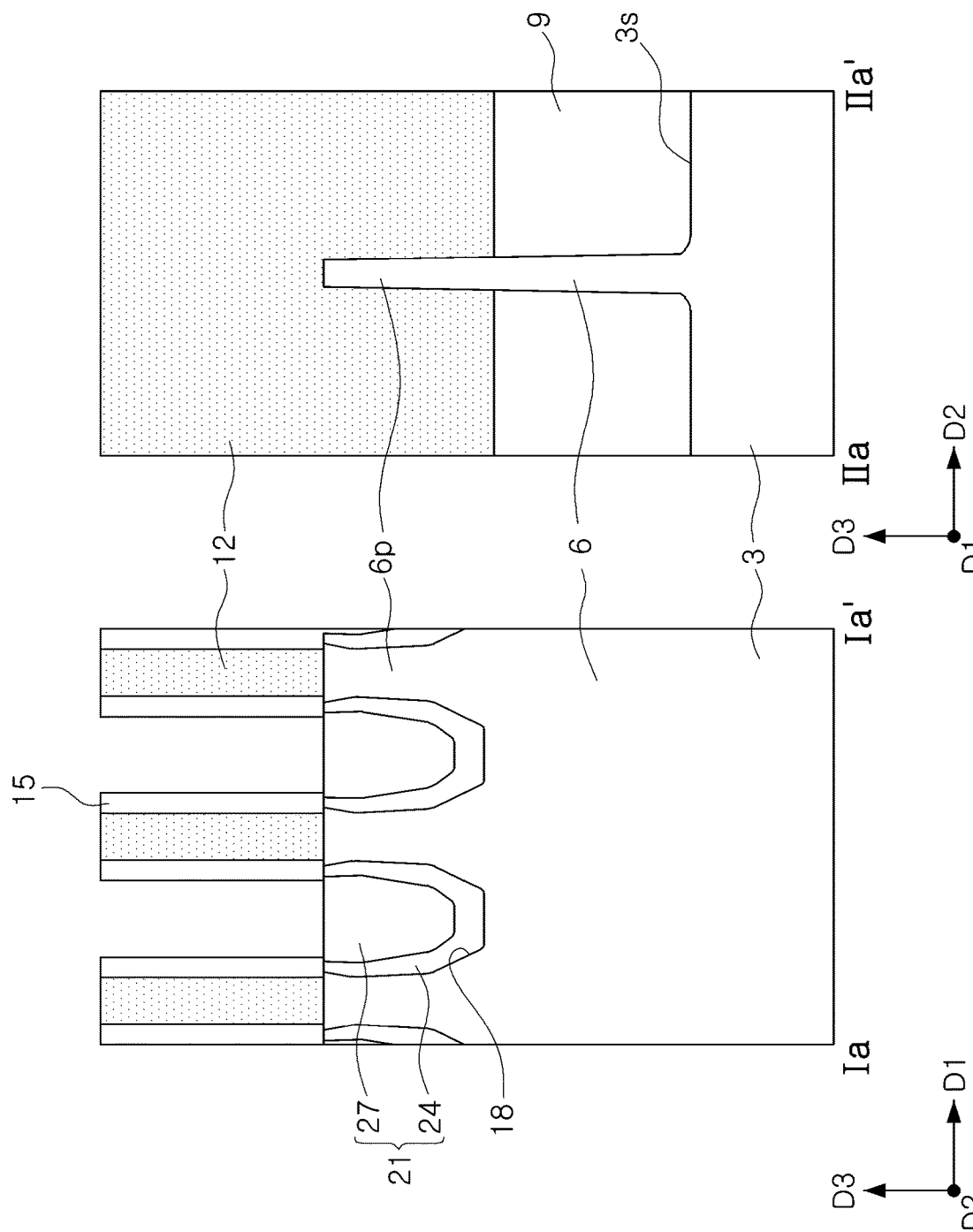
FIGS. 16A to 16B are cross-sectional views illustrating a method of manufacturing a semiconductor device, according to example embodiments of the present disclosure.
Figure 16B:
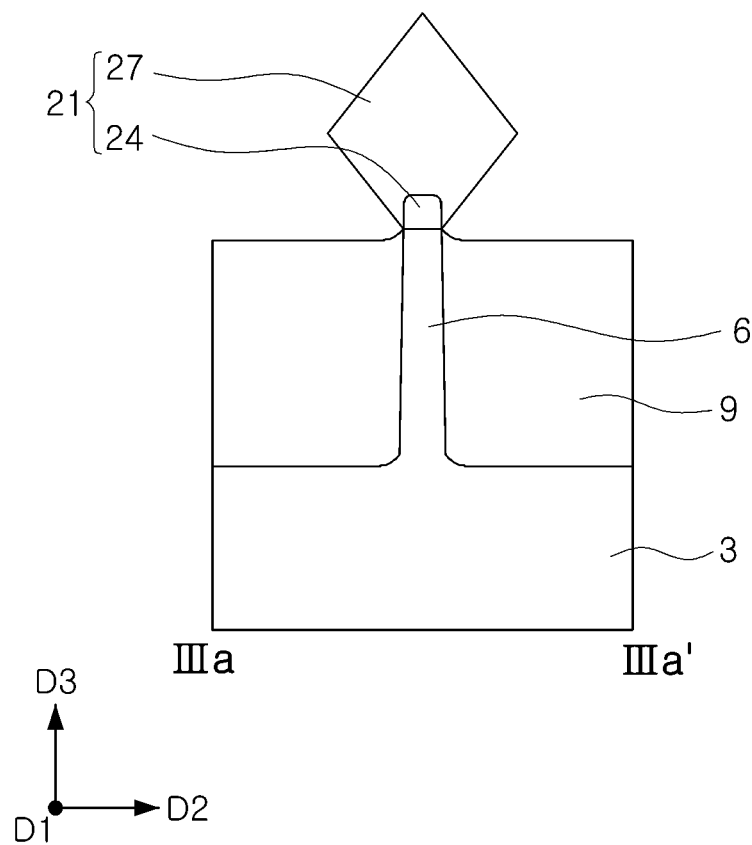

Referring to FIGS. 15, 16A, and 16B, an isolation layer 9 defining an active region 6 may be formed on the semiconductor substrate 3.

In an example, the active region 6 may have a linear shape or a bar shape extending lengthwise in a first horizontal direction D1.

The first horizontal direction D1 may be parallel to an upper surface of the semiconductor substrate 3.

In an example, the isolation layer 9 may be a trench isolation layer (a shallow trench isolation layer). The isolation layer 9 may be formed of an insulating material such as silicon oxide, or the like.

In an example, the active region 6 may include a channel region 6p located at a level higher than an upper surface of the isolation layer 9.

The channel region 6p of the active region 6 may have N-type conductivity or P-type conductivity. For example, when the channel region 6p is a channel region of an NMOS transistor, the channel region 6p may have P-type conductivity. Alternatively, when the channel region 6p has a channel region of a PMOS transistor, the channel region 6p may have an N-type conductivity.

A sacrificial structure 12 may be formed (S10). The sacrificial structure 12 may overlap the active region 6 and the isolation layer 9 on the semiconductor substrate 3.

The sacrificial structure 12 may have a linear shape or a bar shape extending lengthwise in a second horizontal direction D2 perpendicular to the first horizontal direction D1.

The second horizontal direction D2 may be parallel to an upper surface of the semiconductor substrate 203.

The sacrificial structure 12 may be provided as a plurality of sacrificial structures.

In an example, the sacrificial structure 12 may include polysilicon.

A gate spacer 15 may be formed on a side surface of the sacrificial structure 12.

The gate spacer 15 may be formed of a single material layer or a mixed material layer.

A source/drain recess region 18 may be formed (S20). Forming of a source/drain recess region 18 may include etching the channel region 6p of the active region 6 using an etching process using the sacrificial structure 12 and the gate spacer 15 as an etch mask. The source/drain recess region 18 may be formed in the channel region 6p of the active region 6.

In the source/drain recess region 18, a first epitaxial region 27 may be formed (S30).

In another example embodiment, before the first epitaxial region 27 is formed, forming of a base epitaxial region 24 may be further included, and the base epitaxial region 24 may be grown epitaxially from a surface of the source/drain recess region 18 of the channel region 6p.

The first epitaxial region 27 may be grown epitaxially from a surface of the base epitaxial region 24.

When the channel region 6p has N-type conductivity, the base epitaxial region 24 and the first epitaxial region 27 may be formed to have P-type conductivity.

In an example, the base epitaxial region 24 and the first epitaxial region 27 may form a preliminary source/drain region 21.

Figure 17A:
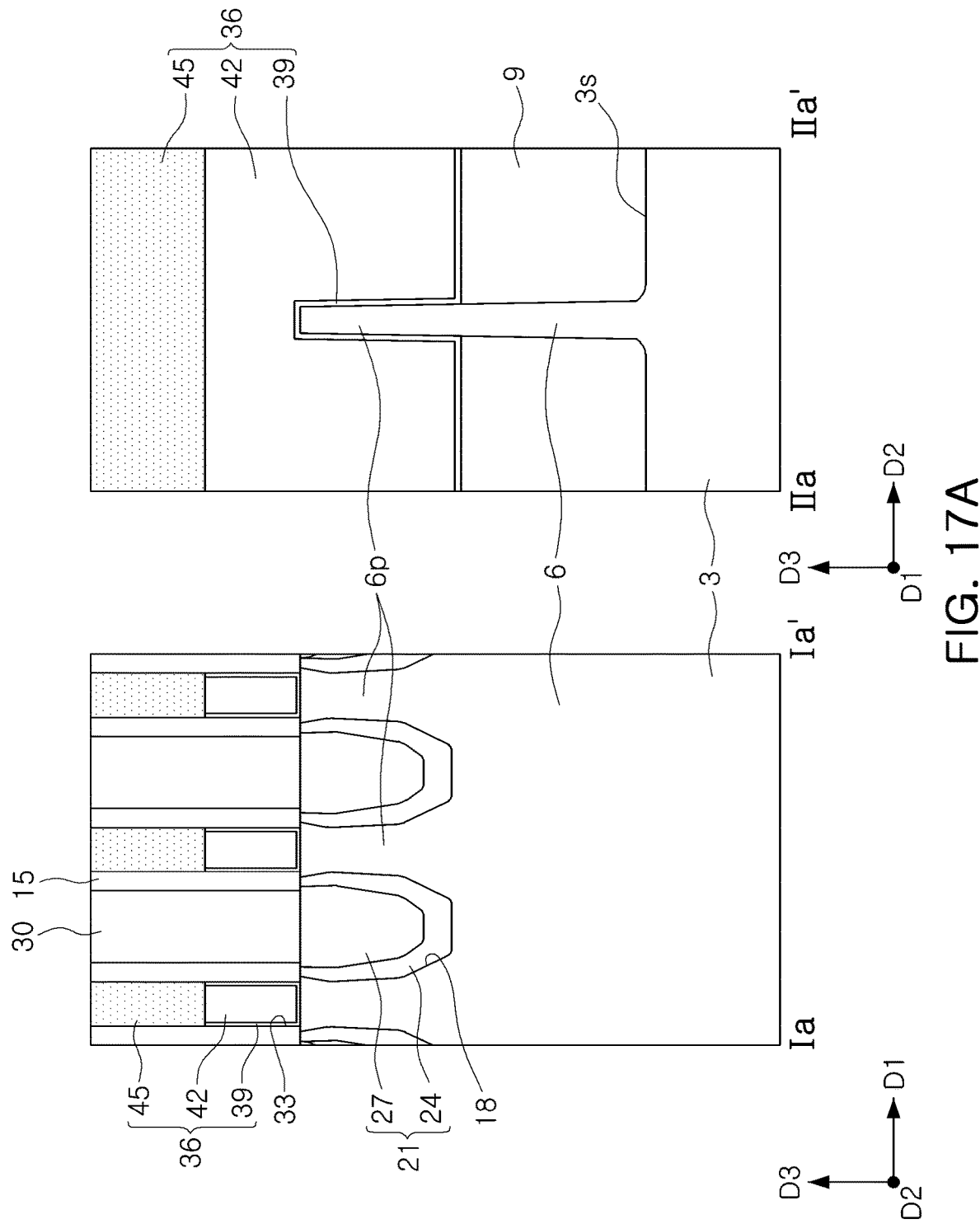
FIGS. 17A to 17B are cross-sectional views illustrating a method of manufacturing a semiconductor device, according to example embodiments of the present disclosure.
Figure 17B:
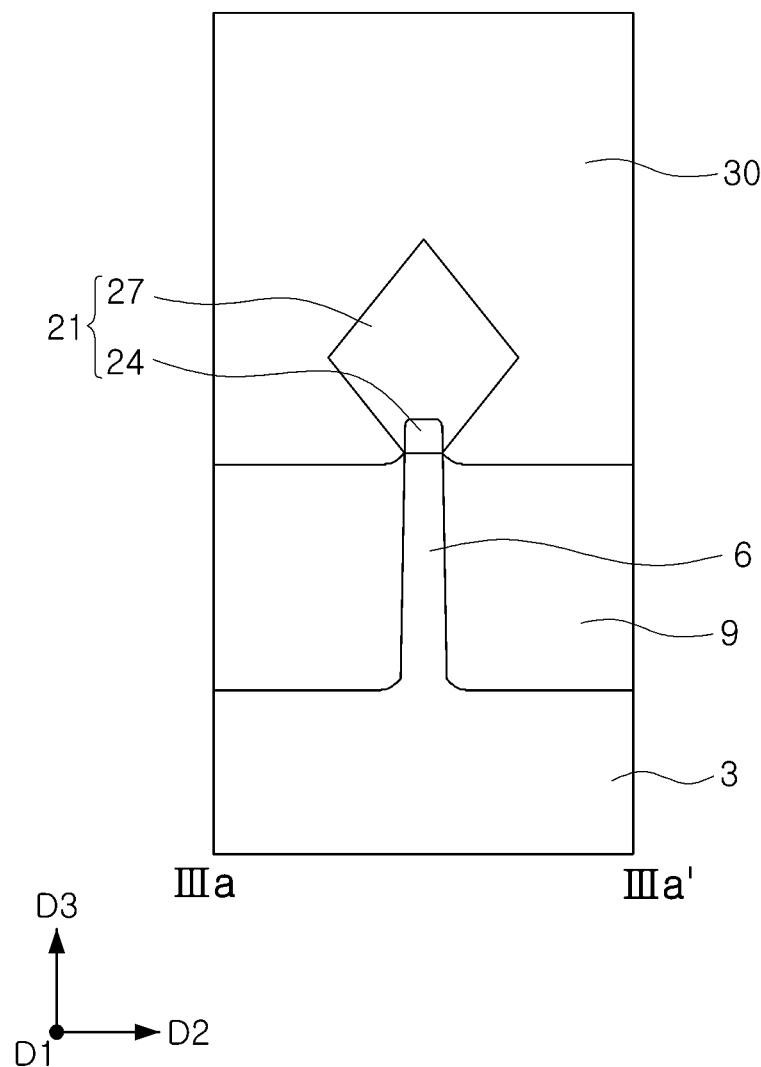

Referring to FIGS. 15, 17A, and 17B, an interlayer insulating layer 30 may be formed (S40). The interlayer insulating layer 30 may cover the preliminary source/drain region 21 and the isolation layer 9 while being adjacent to the sacrificial structure 12. The interlayer insulating layer 30 may be formed of an insulating material such as silicon oxide.

The sacrificial structure 12 of FIGS. 16A and 16B may be replaced with a gate structure 36 (S50).

Replacing the sacrificial structure 12 of FIGS. 16A and 16B with the gate structure 36 may include forming a gate trench 33 by selectively removing the sacrificial structure 12, and forming the gate structure 36 in the gate trench 33.

The forming of the gate structure 36 in the gate trench 33 may include forming of a gate dielectric layer 39 covering an inner wall of the gate trench 33, forming of a gate electrode 42 partially filling the gate trench 33 on the gate dielectric layer 39, and forming a gate capping layer 45 filling a remaining portion of the gate trench 33 on the gate electrode 42.

Figure 18A:
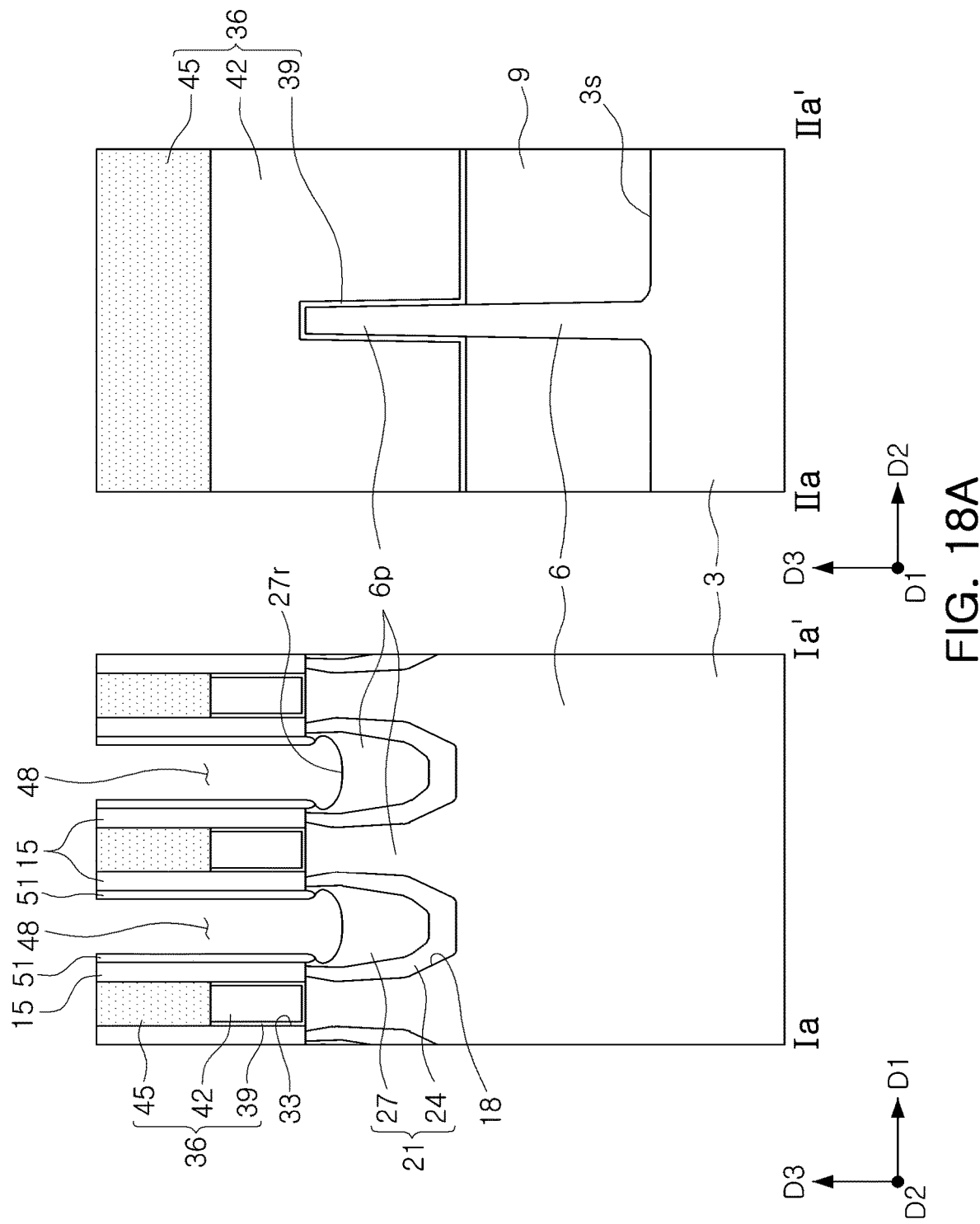
FIGS. 18A to 18B are cross-sectional views illustrating a method of manufacturing a semiconductor device, according to example embodiments of the present disclosure.
Figure 18B:
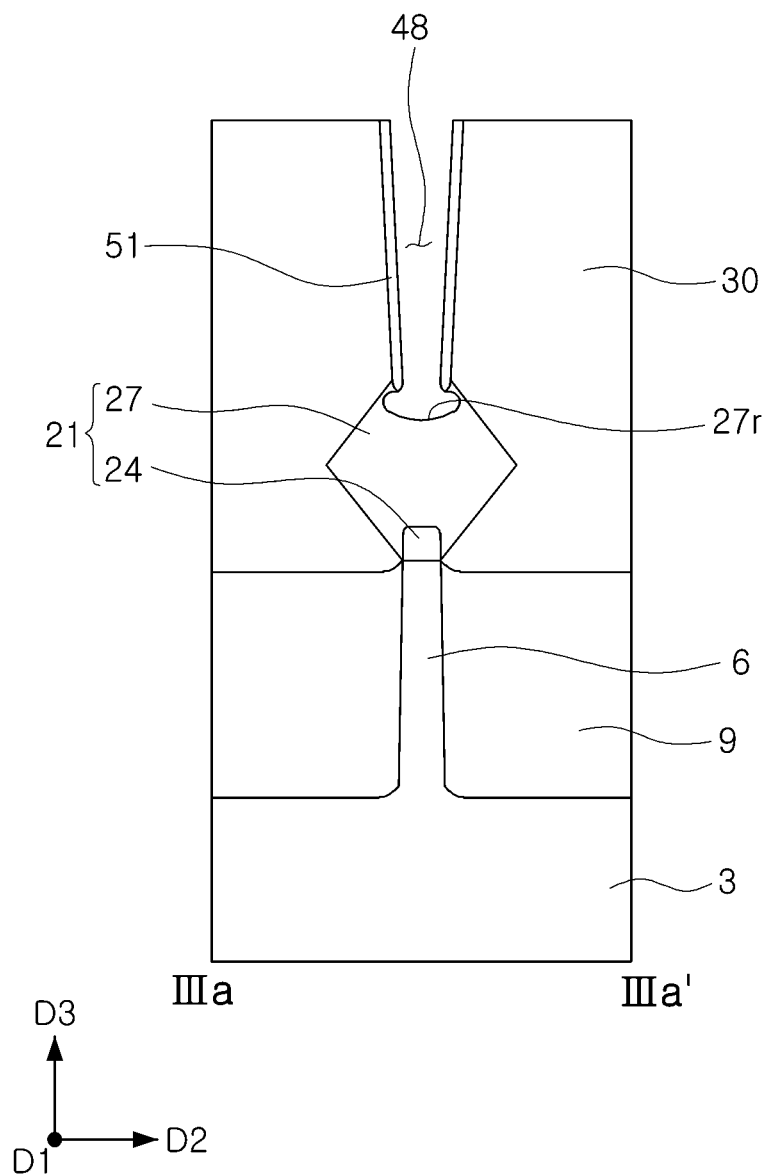

Referring to FIGS. 15, 18A, and 18B, a contact hole 48 may be formed (S60). The contact hole 48 may expose the preliminary source/drain region 21 while passing through the interlayer insulating layer 30.

A contact spacer 51 may be formed on a side wall of the contact hole 48 (S70).

The first epitaxial region 27 of the preliminary source/drain region 21 is partially etched, to form a recessed surface 27r of the first epitaxial region 27.

In an example, the recessed surface 27r may be spaced apart from a lower end of the contact spacer 51.

Referring to FIGS. 1, 2A, 2B, and 2C, together with FIG. 15, a second epitaxial region 54, grown epitaxially from the recessed surface 27r, may be formed (S90). The second epitaxial region 54, the first epitaxial region 27, and the base epitaxial region 24 may form a source/drain region 21a.

A contact structure 57 may be formed (S100). The contact structure 57 may fill the contact hole 48. The contact structure 57 may include a metal-semiconductor compound layer 60 in contact with the second epitaxial region 54 of the source/drain region 21a, and a contact plug 63 on the metal-semiconductor compound layer 60.

Formation of the contact structure 57 may include forming the metal-semiconductor compound layer 60 in contact with the second epitaxial region 54 of the source/drain region 21a by performing a silicide process, and forming the contact plug 63 filling the contact hole 48 on the metal-semiconductor compound layer 60.

Formation of the contact plug 63 may include forming a first conductive layer 66 covering an inner wall of the contact hole 48, and forming a second conductive layer 69 filling the contact hole 48 on the first conductive layer 66.

As set forth above, according to example embodiments of the present inventive concept, a source/drain region may include a base epitaxial region, a first epitaxial region on the base epitaxial region, and a second epitaxial region on the first epitaxial region. The second epitaxial region may be a stressor which could apply stress to a channel region in order to improve charge mobility. The second epitaxial region may be spaced apart from the channel region, and may be in contact with a contact plug. Since an impurity concentration of the second epitaxial region in the source/drain region is the highest, a channel region may be prevented from being degraded by impurities in a source/drain region, while contact resistance between the source/drain region and the contact plug may be significantly reduced. Therefore, performance of a transistor may be improved.

While example embodiments have been shown and described above, it will be apparent to those skilled in the art that modifications and variations could be made without departing from the scope of the present disclosure, as defined by the appended claims.

What is claimed is:

1. A method of forming a semiconductor device, comprising:
    forming an active pattern, wherein the active pattern has a first active portion and a second active portion;
    forming an isolation layer on a side surface of a lower region of the active pattern, wherein the isolation layer has a first isolation portion and a second isolation portion;
    forming a structure on the first active portion of the active pattern and the first isolation portion of the isolation layer;
    forming a source/drain recess region by etching the second active portion of the active pattern using an etching process using the structure as an etch mask;
    forming a first epitaxial region in the source/drain recess region;
    forming an interlayer insulating layer on the first epitaxial region and the second isolation portion of the isolation layer;
    forming a contact hole penetrating through the interlayer insulating layer and exposing the first epitaxial region;
    forming an insulating contact spacer on a sidewall of the contact hole;
    partially etching the first epitaxial region exposed by the contact hole to form a recessed surface of the first epitaxial region, after forming the insulating contact spacer;
    forming a second epitaxial region on the recessed surface of the first epitaxial region; and
    forming a contact structure contacting the second epitaxial region,
    wherein the second epitaxial region vertically overlaps the insulating contact spacer and the contact structure.

2. The method of claim 1,
    wherein a lower end of the insulating contact spacer is exposed after forming the recessed surface of the first epitaxial region, and
    wherein the second epitaxial region contacts the lower end of the insulating contact spacer.

3. The method of claim 1, further comprising:
    forming a base epitaxial region in the source/drain recess region, before forming the first epitaxial region,
    wherein the first epitaxial region is on the base epitaxial region.

4. The method of claim 3, wherein an upper end of the base epitaxial region is at a height level the same as or higher than an uppermost surface of the first epitaxial region.

5. The method of claim 1,
    wherein the contact structure includes a metal-semiconductor compound layer, and a contact plug on the metal-semiconductor compound layer, and
    wherein the metal-semiconductor compound layer contacts the insulating contact spacer and the second epitaxial region.

6. The method of claim 5, wherein the metal-semiconductor compound layer is spaced apart from the first epitaxial region by the second epitaxial region.

7. The method of claim 1, wherein the insulating contact spacer contacts the first epitaxial region and the second epitaxial region.

8. The method of claim 1, further comprising:
    after forming the interlayer insulating layer, replacing the structure with a gate structure,
    wherein the gate structure includes a gate dielectric layer and a gate electrode on the gate dielectric layer.

9. The method of claim 8,
    wherein the active pattern includes a fin region and a channel region on the fin region,
    wherein the isolation layer is on a side surface of the fin region, and
    wherein the first and second epitaxial regions are on a side surface of the channel region.

10. The method of claim 9,
    wherein the channel region includes a plurality of active layers stacked while being spaced apart from each other in a vertical direction,
    wherein the gate electrode covers an upper surface, a side surface, and a lower surface of each of the plurality of active layers in a first direction, and
    wherein the gate dielectric layer is between the gate electrode and the plurality of active layers.

11. The method of claim 10, wherein a lower end of the second epitaxial region is at a lower level than the upper surface of an uppermost active layer of the plurality of active layers.

12. The method of claim 10, wherein the second epitaxial region is spaced apart from the channel region.

13. The method of claim 8, wherein the structure includes a sacrificial pattern and a gate spacer on a side surface of the sacrificial pattern,
wherein replacing the structure with the gate structure includes:
forming a gate trench by removing the sacrificial pattern; and
forming the gate structure in the gate trench, and
wherein a portion of the gate spacer is between the insulating contact spacer and the gate structure.

14. The method of claim 1,
wherein at least one of the first and second epitaxial regions includes a Si element and a Ge element, and
wherein a Ge element concentration in the first epitaxial region and a Ge element concentration in the second epitaxial region are different from each other.

15. A method of forming a semiconductor device, comprising:
forming an active pattern on a substrate, wherein the active pattern has a first active portion and a second active portion;
forming a structure on the first active portion of the active pattern, wherein the structure extends lengthwise in a first horizontal direction;
forming a source/drain recess region by etching the second active portion of the active pattern using an etching process using the structure as an etch mask;
forming a first epitaxial region in the source/drain recess region, wherein the first epitaxial region is adjacent to the first active portion in a second horizontal direction perpendicular to the first horizontal direction;
forming an interlayer insulating layer on the first epitaxial region;
forming a contact hole penetrating through the interlayer insulating layer and exposing the first epitaxial region, wherein a sidewall of the contact hole has a lower end;
forming an insulating contact spacer on the sidewall of the contact hole;
partially etching the first epitaxial region exposed by the contact hole to form a recessed surface of the first epitaxial region;
forming a second epitaxial region on the recessed surface of the first epitaxial region; and
forming a contact structure in contact with the second epitaxial region,
wherein a maximum width of the second epitaxial region in the second horizontal direction is greater than a minimum width of a lower region of the contact hole in the second horizontal direction, and
wherein the second epitaxial region and the contact structure contact the insulating contact spacer.

16. The method of claim 15,
wherein the lower end of the second epitaxial region is at a lower level than a lower end of the insulating contact spacer,
wherein an upper end of the second epitaxial region is at a higher level than the lower end of the insulating contact spacer, and
wherein the second epitaxial region vertically overlaps the lower end of the insulating contact spacer.

17. The method of claim 15, further comprising:
after the forming the interlayer insulating layer, replacing the structure with a gate structure,
wherein the gate structure includes a gate dielectric layer and a gate electrode on the gate dielectric layer,
wherein the active pattern includes a fin region and a channel region on the fin region,
wherein the channel region includes a plurality of active layers stacked while being spaced apart from each other in a vertical direction,
wherein the gate electrode covers an upper surface, a side surface, and a lower surface of each of the plurality of active layers in the first horizontal direction,
wherein the gate dielectric layer is between the gate electrode and the plurality of active layers, and
wherein the lower end of the second epitaxial region is at a lower level than the upper surface of an uppermost active layer of the plurality of active layers.

18. A method of forming a semiconductor device, comprising:
forming an active pattern, wherein the active pattern has a first active portion and a second active portion;
forming an isolation layer on a side surface of a lower region of the active pattern, wherein the isolation layer has a first isolation portion and a second isolation portion;
forming a structure on the first active portion of the active pattern and the first isolation portion of the isolation layer;
forming a source/drain recess region by etching the second active portion of the active pattern using an etching process using the structure as an etch mask;
forming a first epitaxial region in the source/drain recess region;
forming an interlayer insulating layer on the first epitaxial region and the second isolation portion of the isolation layer;
forming a contact hole penetrating through the interlayer insulating layer and exposing the first epitaxial region;
forming an insulating contact spacer on a sidewall of the contact hole;
partially etching the first epitaxial region exposed by the contact hole to form a recessed surface of the first epitaxial region, after forming the insulating contact spacer;
forming a second epitaxial region on the recessed surface of the first epitaxial region; and
forming a contact structure contacting the second epitaxial region,
wherein an upper end of the first epitaxial region is at a higher level than an upper end of the second epitaxial region.

19. The method of claim 18, wherein the insulating contact spacer contacts the first epitaxial region and the second epitaxial region.

* * * * *